(12) United States Patent
Elmieh et al.

(10) Patent No.: US 10,099,429 B2
(45) Date of Patent: Oct. 16, 2018

(54) METHODS FOR GENERATING 3D PRINTED SUBSTRATES FOR ELECTRONICS ASSEMBLED IN A MODULAR FASHION

(71) Applicant: Facebook, Inc., Menlo Park, CA (US)

(72) Inventors: Baback Elmieh, Palo Alto, CA (US); Saurabh Palan, Mountain View, CA (US); Andrew Alexander Robberts, Douro-Dummer (CA); Alexandre Jais, San Francisco, CA (US)

(73) Assignee: Facebook, Inc., Menlo Park, CA (US)

( * ) Notice: Subject to any disclaimer, the term of this patent is extended or adjusted under 35 U.S.C. 154(b) by 312 days.

(21) Appl. No.: 14/921,882

(22) Filed: Oct. 23, 2015

(65) Prior Publication Data

US 2016/0144572 A1 May 26, 2016

Related U.S. Application Data

(60) Provisional application No. 62/067,712, filed on Oct. 23, 2014.

(51) Int. Cl.
*B29C 67/00* (2017.01)
*G06F 17/50* (2006.01)
(Continued)

(52) U.S. Cl.
CPC ........ *B29C 67/0088* (2013.01); *B29C 64/386* (2017.08); *B33Y 50/02* (2014.12);
(Continued)

(58) Field of Classification Search
None
See application file for complete search history.

(56) References Cited

U.S. PATENT DOCUMENTS 6,100,178 A    8/2000   Todd et al.
6,833,511 B2  12/2004   Uchinono et al.
(Continued)

FOREIGN PATENT DOCUMENTS

EP    1209959 A2    5/2002
EP    1886793 A1    2/2008
(Continued)

OTHER PUBLICATIONS

U.S. Appl. No. 14/921,868, filed Oct. 23, 2015, Elmieh et al.
(Continued)

*Primary Examiner* — Lex Malsawma
(74) *Attorney, Agent, or Firm* — Fenwick & West LLP

(57) ABSTRACT

Systems, media, and methods for modeling electronic products for 3D printing including providing a library of modules and module interfaces; receiving at least one ruleset; receiving preliminary substrate structure data, the preliminary substrate structure data comprising shape and volume data defining a substrate; providing an interface allowing the user to place one or more modules on the substrate; providing an interface allowing the user to place one or more module interfaces, the module interfaces coupling one or more modules together through the substrate; warning the user where placement of a module or module interface violates the at least one ruleset; generating routing of electrically conductive interconnects between placed module interfaces; and generating a finalized substrate structure model by combining the preliminary substrate structure data with module placement data and interconnect routing data.

20 Claims, 22 Drawing Sheets

(51) Int. Cl.
*B33Y 50/02* (2015.01)
*B29C 64/386* (2017.01)
*G05B 19/4099* (2006.01)
*H05K 3/00* (2006.01)

(52) U.S. Cl.
CPC .......... *G06F 17/50* (2013.01); *G05B 19/4099* (2013.01); *G05B 2219/35134* (2013.01); *G05B 2219/49007* (2013.01); *G05B 2219/49023* (2013.01); *H05K 3/0005* (2013.01); *Y02T 10/82* (2013.01)

(56) References Cited

U.S. PATENT DOCUMENTS

| | | | |
|---|---|---|---|
| 7,516,437 B1* | 4/2009 | Kannan | G06F 17/5077 716/126 |
| 7,520,740 B2 | 4/2009 | Wahlstrom et al. | |
| 8,033,014 B2 | 10/2011 | Yu et al. | |
| 2002/0062987 A1 | 5/2002 | Uchinono et al. | |
| 2011/0253435 A1 | 10/2011 | Huang et al. | |
| 2012/0065755 A1* | 3/2012 | Steingart | A61C 13/0019 700/98 |
| 2012/0185216 A1 | 7/2012 | El-Essawy et al. | |
| 2012/0309127 A1 | 12/2012 | Farooq et al. | |
| 2013/0073073 A1* | 3/2013 | Pettis | B29C 67/0055 700/119 |
| 2013/0326457 A1* | 12/2013 | MacMunn | G06F 17/5072 716/122 |
| 2014/0054795 A1 | 2/2014 | Romig et al. | |
| 2014/0178588 A1* | 6/2014 | Swanson | B29C 67/0059 427/288 |
| 2014/0268604 A1 | 9/2014 | Wicker et al. | |
| 2014/0272522 A1 | 9/2014 | Pugh et al. | |

FOREIGN PATENT DOCUMENTS

| | | |
|---|---|---|
| EP | 2779272 A1 | 9/2014 |
| WO | WO 2015/127271 A1 | 8/2015 |

OTHER PUBLICATIONS

Cheng, et al. Microfluidic stretchable RF electronics. Lab Chip, 2010,10, 3227-3234. DOI: 10.1039/C005159D.

International search report and written opinion dated Jan. 14, 2016 for PCT/US2015/057236.

Patrick, et al. DNA Assembly in 3D Printed Fluidics. 3D-Printing of Milli and Microfluidics for Synthetic Biology Applications. 2015. http://matter.media.mit.edu/tools/details/dna-assembly-in-3d-printed-fluidics.

Patrick, et al. Wanderers: Living Mushtari. 2015. http://matter.media.mit.edu/environments/details/wanderers-living-mushtari.

Wu, et al. 3D-printed microelectronics for integrated circuitry and passive wireless sensors. Microsystems & Nanoengineering 1, Article No. 15013 (2015) doi:10.1038/micronano.2015.13.

Biggs. The rabbit proto can print real electronics. Tech Crunch. Apr. 25, 2014. video timestamp 0:40-0:52. http://techcrunch.com/2014/04/25/the-rabbit-proto-can-print-real-electronics/.

International search report and written opinion dated Feb. 2, 2016 for PCT/US2015/057114.

Printed circuits as part of a 3-D printed object (video). Slashdot. May 27, 2014. Video timestamp 9:20-9:58. http://hardware.slashdot.org/story/14/05/27/2044212/printed-circuits-as-part-of-a-3-d-printed-object-video.

Canadian Intellectual Property Office, Office Action, Canadian Patent Application No. 2,965,144, dated Feb. 8, 2018, four pages.

European Patent Office, Search Report and Opinion, European Patent Application No. 15853356.2, dated May 16, 2018, fifteen pages.

* cited by examiner

Fig. 2A
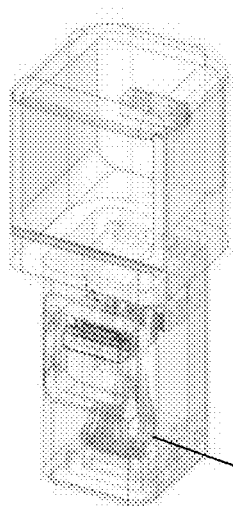
Intermediate structures for conductive traces
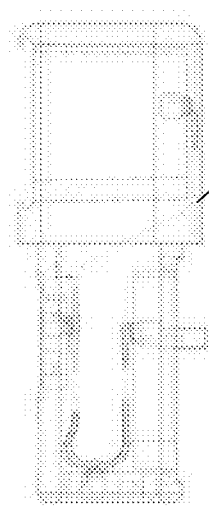
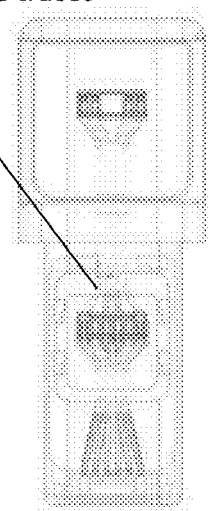
Fig. 2B  Fig. 2C

Color or other pattern indicates rule violations

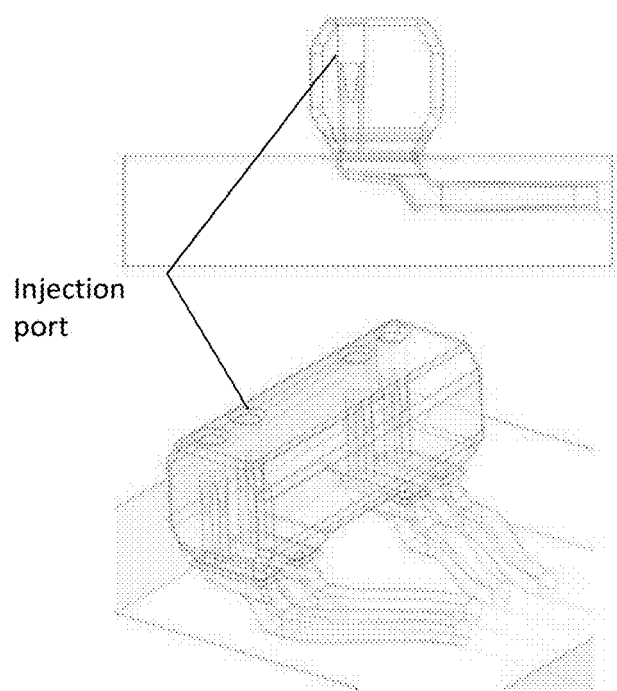
Injection port
Fig. 11A
Fig. 11B
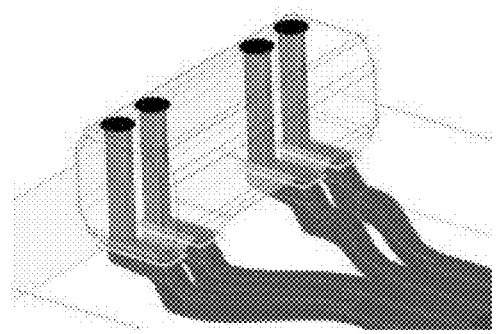
Fig. 11C
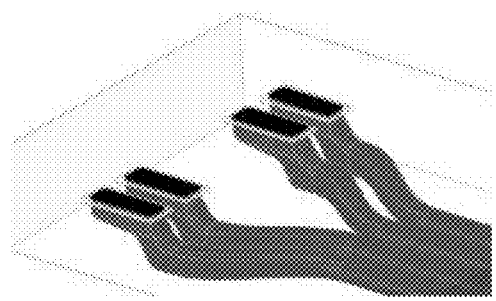
Fig. 11D

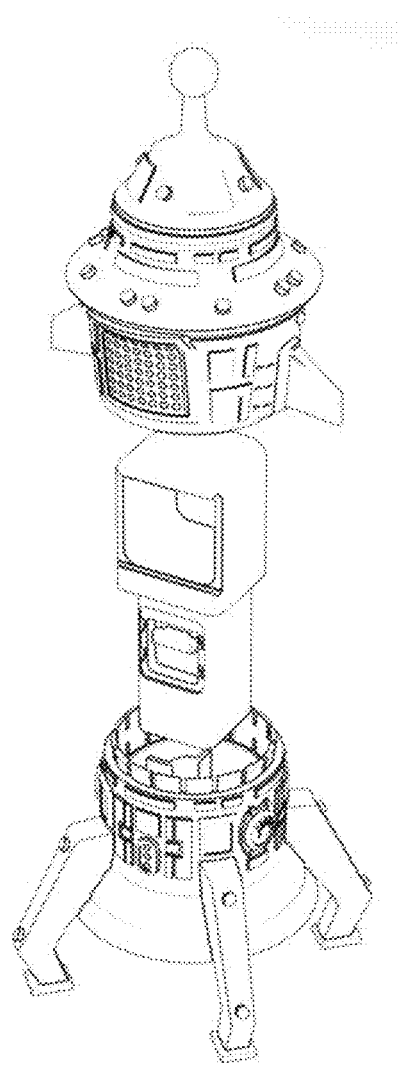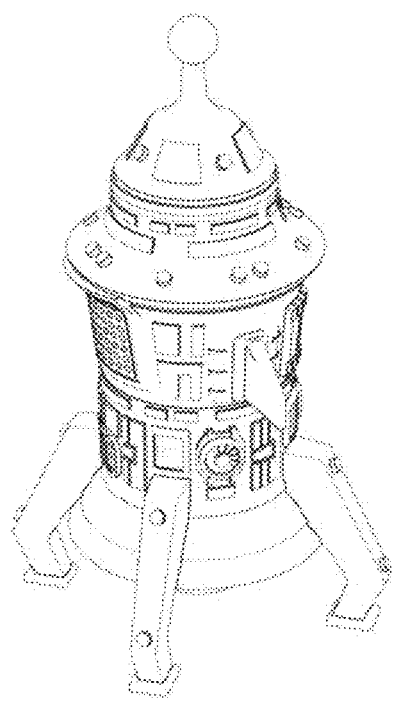
Fig. 16A
Fig. 16B

METHODS FOR GENERATING 3D PRINTED SUBSTRATES FOR ELECTRONICS ASSEMBLED IN A MODULAR FASHION

CROSS-REFERENCE TO RELATED APPLICATIONS

This application claims the benefit of U.S. Application Ser. No. 62/067,712, filed Oct. 23, 2014, which is herein incorporated by reference in its entirety.

TECHNICAL FIELD OF THE INVENTION

The subject matter disclosed herein relates generally to the 3D printing field, and more specifically to new and useful methods for generating 3D printed substrates for electronics assembled in a modular fashion in the 3D printing field.

BACKGROUND OF THE INVENTION 3D printing is a rapidly advancing technology used for a variety of applications, including architecture, industrial design, automotive manufacture, medicine, fashion, and electronics.

SUMMARY OF THE INVENTION

Unfortunately, while many advances have been made in the field, current methods of integrating 3D printed structures with electronics often have high complexity and expense requirements, limiting the potential impact of 3D printing technology in key areas. Thus, there is a need in the 3D printing field to create methods for generating 3D printed substrates for electronics assembled in a modular fashion.

In one aspect, disclosed herein are computer-implemented systems comprising a digital processing device comprising at least one processor, an operating system configured to perform executable instructions, a memory, and a computer program including instructions executable by the digital processing device to create a 3D modeling application for 3D printed electronic products, the application comprising: a library of modules and module interfaces; a software module receiving at least one ruleset; a software module receiving preliminary substrate structure data, the preliminary substrate structure data comprising shape and volume data defining a substrate; a software module presenting an interface allowing the user to place one or more modules on the substrate; a software module presenting an interface allowing the user to place one or more module interfaces, the module interfaces coupling one or more modules together through the substrate; a software module warning the user where placement of a module or module interface violates the at least one ruleset; a software module generating routing of electrically conductive interconnects between placed module interfaces; a software module generating a finalized substrate structure model by combining the preliminary substrate structure data with module placement data and interconnect routing data to define a 3D printed electronic product; and a software module communicating an instruction file to an additive or subtractive manufacturing apparatus or system, the instruction file comprising one or more toolpaths to manufacture the 3D printed electronic product. In some embodiments, the library of pre-defined modules comprises one or more sensor modules, one or more processor modules, one or more storage modules, one or more communication modules, one or more display modules, and one or more power modules. In some embodiments, the application further comprises a software module presenting an interface allowing the user to define custom modules and a custom module ruleset for each custom module. In some embodiments, the interface to input preliminary substrate structure data comprises a 3D modeling tool. In further embodiments, the 3D modeling tool is a voxel-based modeling tool. In some embodiments, the software module receiving preliminary substrate structure data allows the user to import substrate structure data. In some embodiments, the one or more module interfaces couple one or more modules together mechanically, electrically, or both mechanically and electrically. In some embodiments, the application further comprises a software module presenting an interface allowing the user to define custom module interfaces. In some embodiments, the generating routing of electrically conductive interconnects comprises placement of temporary intermediate structures for interconnects. In some embodiments, the warning prevents the user from taking an action. In some embodiments, the at least one ruleset comprises: a fabrication ruleset, a material ruleset, and a module ruleset. In further embodiments, the fabrication ruleset comprises rules directed to a material restriction, a tool restriction, or a technique restriction. In still further embodiments, the fabrication ruleset comprises rules directed to a minimum resolution, a maximum size, or a fabrication speed. In further embodiments, the material ruleset comprises rules directed to a resolution, a size, an aspect ratio, or a fabrication speed. In further embodiments, the module ruleset comprises rules directed to a connector placement, a mechanical binding, a semantic dependency, or a compatibility. In some embodiments, the routing of electrically conductive interconnects between module interfaces is generated by applying an A* path-finding algorithm. In some embodiments, the routing of electrically conductive interconnects between module interfaces adheres to the fabrication ruleset, the material ruleset, and the module ruleset. In a particular embodiment, the instruction file is a STereoLithography (STL) file. In various embodiments, the additive or subtractive manufacturing apparatus or system comprises a 3D printer, an injection molding apparatus, CNC milling apparatus, waterjet cutting apparatus, lathe apparatus, or a combination thereof.

In another aspect, disclosed herein are non-transitory computer-readable storage media encoded with a computer program including instructions executable by a processor to create a 3D modeling application for 3D printed electronic products comprising: a library of modules and module interfaces; a software module receiving at least one ruleset; a software module receiving preliminary substrate structure data, the preliminary substrate structure data comprising shape and volume data defining a substrate; a software module presenting an interface allowing the user to place one or more modules on the substrate; a software module presenting an interface allowing the user to place one or more module interfaces, the module interfaces coupling one or more modules together through the substrate; a software module warning the user where placement of a module or module interface violates the at least one ruleset; a software module generating routing of electrically conductive interconnects between placed module interfaces; a software module generating a finalized substrate structure model by combining the preliminary substrate structure data with module placement data and interconnect routing data to define a 3D printed electronic product; and a software module communicating an instruction file to an additive or subtractive manufacturing apparatus or system, the instruction file comprising one or more toolpaths to manufacture the 3D printed electronic product. In some embodiments, the library of pre-defined modules comprises one or more sensor modules, one or more processor modules, one or more storage modules, one or more communication modules, one or more display modules, and one or more power modules. In some embodiments, the application further comprises a software module presenting an interface allowing the user to define custom modules and a custom module ruleset for each custom module. In some embodiments, the interface to input preliminary substrate structure data comprises a 3D modeling tool. In further embodiments, the 3D modeling tool is a voxel-based modeling tool. In some embodiments, the software module receiving preliminary substrate structure data allows the user to import substrate structure data. In some embodiments, the one or more module interfaces couple one or more modules together mechanically, electrically, or both mechanically and electrically. In some embodiments, the application further comprises a software module presenting an interface allowing the user to define custom module interfaces. In some embodiments, the generating routing of electrically conductive interconnects comprises placement of temporary intermediate structures for interconnects. In some embodiments, the warning prevents the user from taking an action. In some embodiments, the at least one ruleset comprises: a fabrication ruleset, a material ruleset, and a module ruleset. In further embodiments, the fabrication ruleset comprises rules directed to a material restriction, a tool restriction, or a technique restriction. In still further embodiments, the fabrication ruleset comprises rules directed to a minimum resolution, a maximum size, or a fabrication speed. In further embodiments, the material ruleset comprises rules directed to a resolution, a size, an aspect ratio, or a fabrication speed. In further embodiments, the module ruleset comprises rules directed to a connector placement, a mechanical binding, a semantic dependency, or a compatibility. In some embodiments, the routing of electrically conductive interconnects between module interfaces is generated by applying an A* path-finding algorithm. In some embodiments, the routing of electrically conductive interconnects between module interfaces adheres to the fabrication ruleset, the material ruleset, and the module ruleset. In a particular embodiment, the instruction file is a STereoLithography (STL) file. In various embodiments, the additive or subtractive manufacturing apparatus or system comprises a 3D printer, an injection molding apparatus, CNC milling apparatus, waterjet cutting apparatus, lathe apparatus, or a combination thereof.

In another aspect, disclosed herein are computer-implemented methods for modeling 3D printed electronic products comprising: providing, in a computer memory, a library or database of modules and module interfaces; receiving, by a computer, at least one ruleset; receiving, by the computer, preliminary substrate structure data, the preliminary substrate structure data comprising shape and volume data defining a substrate; presenting, by the computer, an interface allowing the user to place one or more modules on the substrate; presenting, by the computer, an interface allowing the user to place one or more module interfaces, the module interfaces coupling one or more modules together through the substrate; warning, by the computer, the user where placement of a module or module interface violates the at least one ruleset; generating, by the computer, routing of electrically conductive interconnects between placed module interfaces; generating, by the computer, a finalized substrate structure model by combining the preliminary substrate structure data with module placement data and interconnect routing data to define a 3D printed electronic product; and communicating, by the computer, an instruction file to an additive or subtractive manufacturing apparatus or system, the instruction file comprising one or more toolpaths to manufacture the 3D printed electronic product. In some embodiments, the library of pre-defined modules comprises one or more sensor modules, one or more processor modules, one or more storage modules, one or more communication modules, one or more display modules, and one or more power modules. In some embodiments, the method further comprises presenting, by the computer, an interface allowing the user to define custom modules and a custom module ruleset for each custom module. In some embodiments, the preliminary substrate structure data is received from a 3D modeling tool. In further embodiments, the 3D modeling tool is a voxel-based modeling tool. In some embodiments, the preliminary substrate structure data is received from a user upload. In some embodiments, the one or more module interfaces couple one or more modules together mechanically, electrically, or both mechanically and electrically. In some embodiments, the method further comprises presenting, by the computer, an interface allowing the user to define custom module interfaces. In some embodiments, the generating routing of electrically conductive interconnects comprises placement of temporary intermediate structures for interconnects. In some embodiments, the warning prevents the user from taking an action. In some embodiments, the at least one ruleset comprises: a fabrication ruleset, a material ruleset, and a module ruleset. In further embodiments, the fabrication ruleset comprises rules directed to a material restriction, a tool restriction, or a technique restriction. In still further embodiments, the fabrication ruleset comprises rules directed to a minimum resolution, a maximum size, or a fabrication speed. In further embodiments, the material ruleset comprises rules directed to a resolution, a size, an aspect ratio, or a fabrication speed. In further embodiments, the module ruleset comprises rules directed to a connector placement, a mechanical binding, a semantic dependency, or a compatibility. In some embodiments, the routing of electrically conductive interconnects between module interfaces is generated by applying an A* path-finding algorithm. In some embodiments, the routing of electrically conductive interconnects between module interfaces adheres to the fabrication ruleset, the material ruleset, and the module ruleset. In a particular embodiment, the instruction file is a STereoLithography (STL) file. In various embodiments, the additive or subtractive manufacturing apparatus or system comprises a 3D printer, an injection molding apparatus, CNC milling apparatus, waterjet cutting apparatus, lathe apparatus, or a combination thereof.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Fig." herein), of which:

FIGS. 2A-2E is a set of example views of a substrate for electronics that are assembled in a modular fashion, which include intermediate structures for conductive traces, the views include an iso transparent view (FIG. 2A), a side transparent view (FIG. 2B), a front transparent view (FIG. 2C), an iso solid view of the front (FIG. 2D), and an iso solid view of the back (FIG. 2E);

FIGS. 10A-10E are example views of temporary intermediate structures generated in S140 of FIG. 1, a temporary intermediate structure is shown unfilled (FIG. 10A), the temporary intermediate structure is shown filled (FIG. 10B), a tab can be broken off by the operator by applying force on the tab to generate a controlled fracture at the base (FIG. 10C), the temporary intermediate structure leaves rectangular pads and isolated lines (side view FIG. 10D and iso view FIG. 10E);

FIGS. 11A-11D are example views of temporary intermediate structures generated in S140 of FIG. 1, the views include a side view showing an injection port with an injection structure unfilled (FIG. 11A), an iso view showing an injection port with the injection structure unfilled (FIG. 11B), an iso view with the injection structure filled (FIG. 11C), and an iso view with the injection structure filled and with tabs removed and contacts created (FIG. 11D);

FIGS. 16A and 16B are example views of a generated inner module substrate being placed within an electronic device's outer substrate, the views include and exploded view (FIG. 16A) and an assembled view (FIG. 16B).

Figure 1:
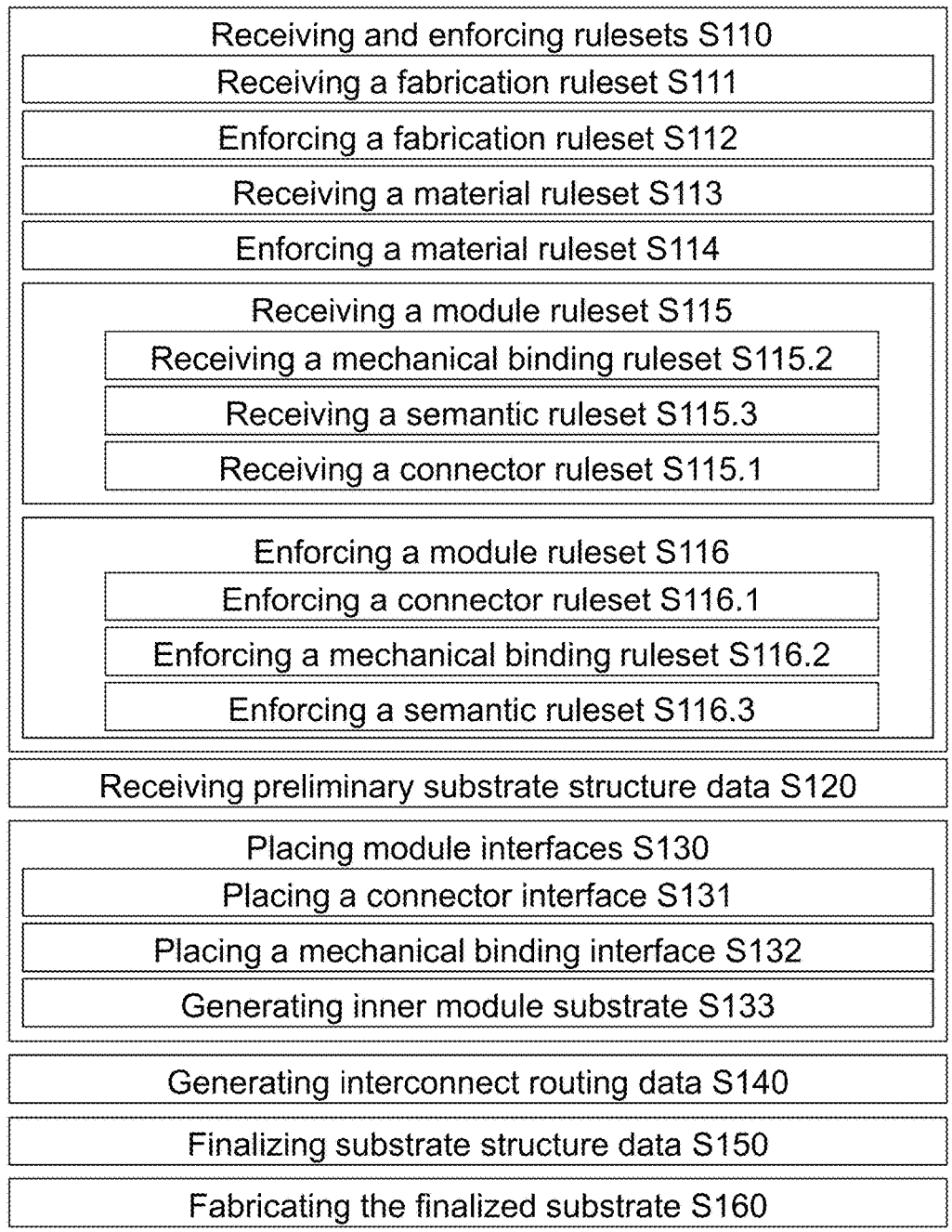
FIG. 1 is a flowchart view of a method of an invention embodiment.
Figure 2D:
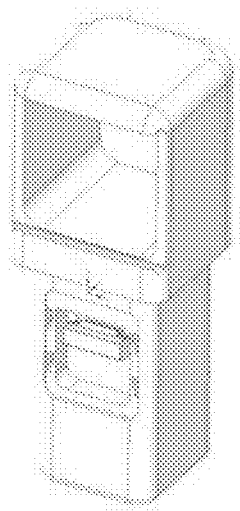
Figure 2E:
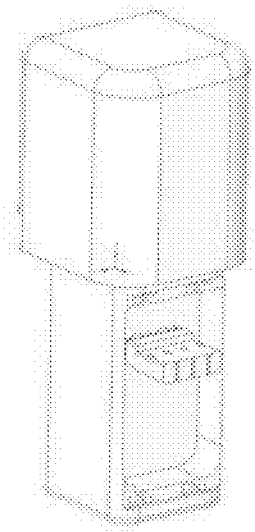

DETAILED DESCRIPTION OF THE INVENTION 3D printing and other additive manufacturing processes have had a massively democratizing effect on the manufacturing industry. The advent of 3D printing enables consumers and small businesses to manufacture products with a minimum of initial investment in either finance or time (e.g., learning specialized manufacturing techniques). With a computer, a 3D printer, and a CAD program, virtually anyone can quickly transform ideas to physical objects.

Unfortunately, the available media for enabling this transformation are currently limited. 3D printing materials for the most common systems include plastics and other similar polymers, most of which are not usable at high temperatures or for applications requiring high conductivity. The result of this, along with resolution limits, is that most common 3D printing techniques are unsuitable for the manufacture of electronics. Consequently, the democratization of manufacturing has for the most part been limited to mechanical structures.

Accordingly, described herein, in certain embodiments, are computer-implemented systems comprising a digital processing device comprising at least one processor, an operating system configured to perform executable instructions, a memory, and a computer program including instructions executable by the digital processing device to create a 3D modeling application for 3D printed electronic products, the application comprising: a library of modules and module interfaces; a software module receiving at least one ruleset; a software module receiving preliminary substrate structure data, the preliminary substrate structure data comprising shape and volume data defining a substrate; a software module presenting an interface allowing the user to place one or more modules on the substrate; a software module presenting an interface allowing the user to place one or more module interfaces, the module interfaces coupling one or more modules together through the substrate; a software module warning the user where placement of a module or module interface violates the at least one ruleset; a software module generating routing of electrically conductive interconnects between placed module interfaces; a software module generating a finalized substrate structure model by combining the preliminary substrate structure data with module placement data and interconnect routing data to define a 3D printed electronic product; and a software module communicating an instruction file to an additive or subtractive manufacturing apparatus or system, the instruction file comprising one or more toolpaths to manufacture the 3D printed electronic product.

Also described herein, in certain embodiments, are non-transitory computer-readable storage media encoded with a computer program including instructions executable by a processor to create a 3D modeling application for 3D printed electronic products comprising: a library of modules and module interfaces; a software module receiving at least one ruleset; a software module receiving preliminary substrate structure data, the preliminary substrate structure data comprising shape and volume data defining a substrate; a software module presenting an interface allowing the user to place one or more modules on the substrate; a software module presenting an interface allowing the user to place one or more module interfaces, the module interfaces coupling one or more modules together through the substrate; a software module warning the user where placement of a module or module interface violates the at least one ruleset; a software module generating routing of electrically conductive interconnects between placed module interfaces; and a software module generating a finalized substrate structure model by combining the preliminary substrate structure data with module placement data and interconnect routing data to define a 3D printed electronic product; and a software module communicating an instruction file to an additive or subtractive manufacturing apparatus or system, the instruction file comprising one or more toolpaths to manufacture the 3D printed electronic product.

Also described herein, in certain embodiments, are computer-implemented methods for modeling 3D printed electronic products comprising: providing, in a computer memory, a library or database of modules and module interfaces; receiving, by a computer, at least one ruleset; receiving, by the computer, preliminary substrate structure data, the preliminary substrate structure data comprising shape and volume data defining a substrate; presenting, by the computer, an interface allowing the user to place one or more modules on the substrate; presenting, by the computer, an interface allowing the user to place one or more module interfaces, the module interfaces coupling one or more modules together through the substrate; warning, by the computer, the user where placement of a module or module interface violates the at least one ruleset; generating, by the computer, routing of electrically conductive interconnects between placed module interfaces; generating, by the computer, a finalized substrate structure model by combining the preliminary substrate structure data with module placement data and interconnect routing data to define a 3D printed electronic product; and communicating, by the computer, an instruction file to an additive or subtractive manufacturing apparatus or system, the instruction file comprising one or more toolpaths to manufacture the 3D printed electronic product.

Certain Definitions

Unless otherwise defined, all technical terms used herein have the same meaning as commonly understood by one of ordinary skill in the art to which this invention belongs. As used in this specification and the appended claims, the singular forms "a," "an," and "the" include plural references unless the context clearly dictates otherwise. Any reference to "or" herein is intended to encompass "and/or" unless otherwise stated.

The term "three-dimensional" structure or object, as used herein, generally refers to any structure or object that is generated by a three-dimensional (3D) manufacturing approach, such as an additive or subtractive approach (e.g., additive or subtractive 3D manufacturing). By way of example, in additive manufacturing, a 3D object may be formed in a layer by layer manner, such as layer-by-layer deposition or layer-by-layer solidification of photopolymer resin in a vat. By way of further example, in subtractive manufacturing, a 3D object may be formed by removing material from a substrate, such as by etching, milling or drilling. Other manufacturing processes suitable for building three-dimensional structures include molding, casting, forming, joining, casting.

The term "intermediate structure," as used herein, generally refers to any structure (or object) that is generated by a three-dimensional printing process that may be used to yield a final or subsequent three-dimensional structure. An intermediate structure may be generated by an additive process or subtractive process.

The term "trace," as used herein, general refers to a component or element that is electrically conductive, thermally conductive, or both electrically conductive and thermally conductive. In some examples, a conductive trace is a conductive structure, channel, wire, or pathway. A trace may be capable of electrically connecting together circuit components. For example, traces may include copper or gold when the substrate is a printed circuit board and may be copper, gold, or printed deposit in a flex circuit. Traces may also be comprised of metallic materials, nonmetallic materials, or mixtures thereof. A trace may include one or more metals selected from copper, aluminum, tungsten, iron, nickel, ruthenium, rhodium, palladium, silver, osmium, iridium, platinum, and gold.

A trace may have a regular or irregular cross-section. In some examples, a trace has a cross-section that is circular, triangular, square, rectangular, pentagonal, or hexagonal, or partial shapes or combinations thereof. A trace can have a width that is from about 50 nanometers (nm) to 5000 micrometers (microns), or about 100 nm to 1000 microns, or 200 nm to 100 microns, or 300 nm to 50 microns. The width can be at least about 10 nm, 50 nm, 100 nm, 500 nm, 1 micron, 10 microns, 50 microns, 100 microns, 500 microns, or 1000 microns. A trace can have a length that spans a dimension (e.g., length, width or height) of a 3D object, or is a portion of the dimension of the 3D object. For example, the trace can be up to about 90%, 80%, 70%, 60%, 50%, 40%, 30%, 20%, 10%, or 5% of a length of the 3D object.

Embodiments of the Invention

The following description of various embodiments of the invention is not intended to limit the invention to these invention embodiments, but rather to enable any person skilled in the art to make and use this invention.

As shown in FIG. 1, a method for generating 3D printed substrates for electronics assembled in a modular fashion (henceforth referred to as modular electronics) preferably includes receiving and enforcing rulesets S110, receiving preliminary substrate structure data S120, placing module interfaces S130, generating interconnect routing data S140, and finalizing substrate structure data S150. In some embodiments, the method additionally includes fabricating the finalized substrate S160.

The method assists in broadening the democratization of manufacturing to electronics. The method functions to enable the design and/or fabrication of substrates for electronics modules, wherein the substrates preferably serve to couple modules mechanically (through the structure of the substrate) and electrically (through conductive interconnects integrated into the substrates), but in some embodiments additionally or alternatively couple modules in any suitable manner. The method preferably assists in making the process of designing and/or fabricating a substrate more accessible to users of varied backgrounds and abilities.

The method preferably assists in making substrate design more accessible by allowing users to design substrate structures (Step S120) in a modeling application or tool that incorporates one or more rulesets designed to help users meet design criteria (Step S110) and also by enabling users to place module interfaces (Step S130) on the substrate structures, while handling routing of interconnects between module interfaces (Step S140).

In a first application, the method assists users in creating a substrate for modular electronics based on a library of pre-existing modules. For example, where a user wants to fabricate a voice recorder; the user optionally defines the body of the recorder in a modeling tool (Step S120), select battery, microphone, processor and speaker modules from a library of pre-existing modules, place module interfaces corresponding to those modules on the body (Step S130) subject to placement rules (Step S110), redesign and update the body of the recorder in a modeling tool (Step 120) to remove or reduce rule violations, and request that the program generate interconnect routings for the module interfaces (Step S140) and then prepare an STL file to send to a 3D printer (Step S150). An example substrate is as shown in FIGS. 2A-2E. Alternatively, if it is desirable for the modules to be hidden beneath the external substrate, the user places the module interfaces beneath the surface of the external substrate. Placing modules beneath the surface of the external substrate will generate a removable inner module substrate (Step S133). Example inner module substrates are shown in FIGS. 15A and 15B and FIGS. 16A and 16B.

Figure 8:
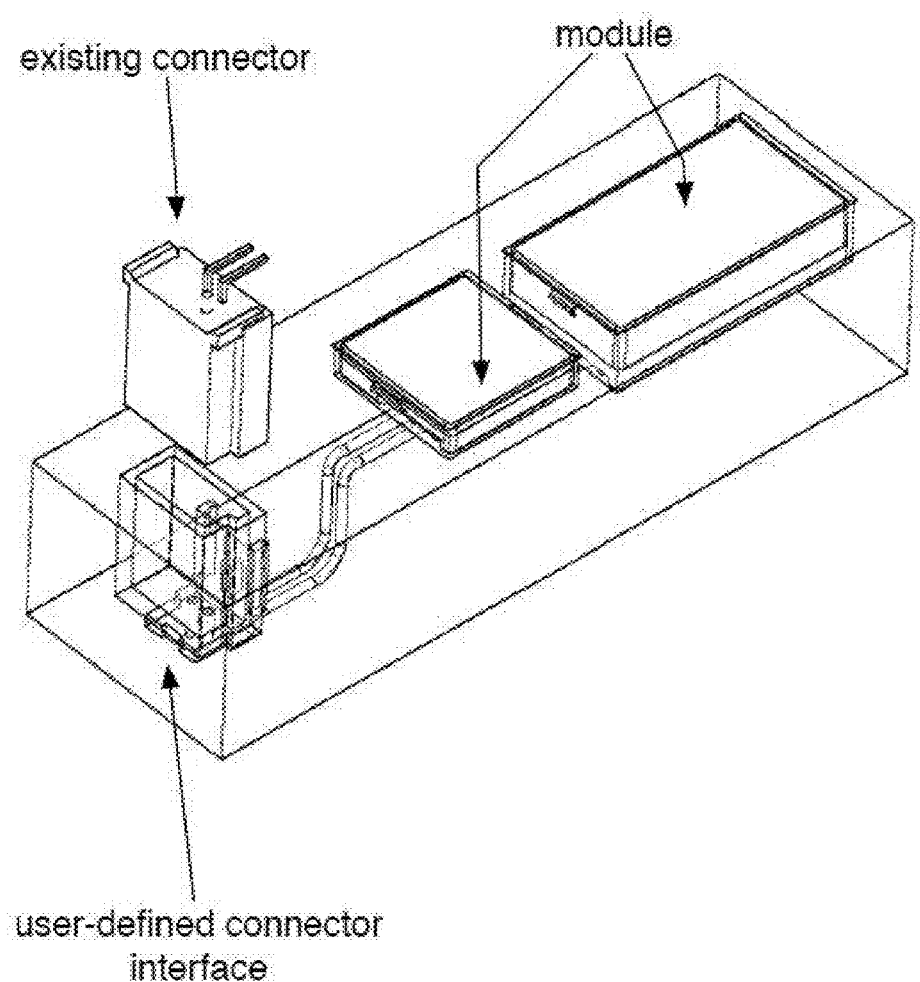
FIG. 8 is an example view of a substrate for electronics that are assembled in a modular fashion, in this example, a substrate for electronics that link a pre-existing module to a custom connector.

In a second application, the method assists in users creating extensions to a pre-existing electronic system by allowing users to connect pre-defined modules from a library of modules with their custom interconnect interfaces and to place those custom interfaces and pre-defined modules on a substrate. For example, where a user wants to create an interconnect between a pre-existing automotive subsystem and a Bluetooth-enabled diagnostics object that the user creates using pre-existing modules from a library. The user optionally defines the body of the diagnostic object in a modeling tool (Step S120), and place the pre-existing Bluetooth module on the body (Step S130) subject to placement rules (Step S110). The user then defines the automotive connector's interface and mechanical structure and places those on the body (Step S131 and Step S132) and requests the program to generate interconnect routings for the pre-defined module interface and custom interfaces (Step S140) and then prepare an STL file to send to a 3D printer (Step S150). An example substrate is as shown in FIG. 8.

Figure 9:
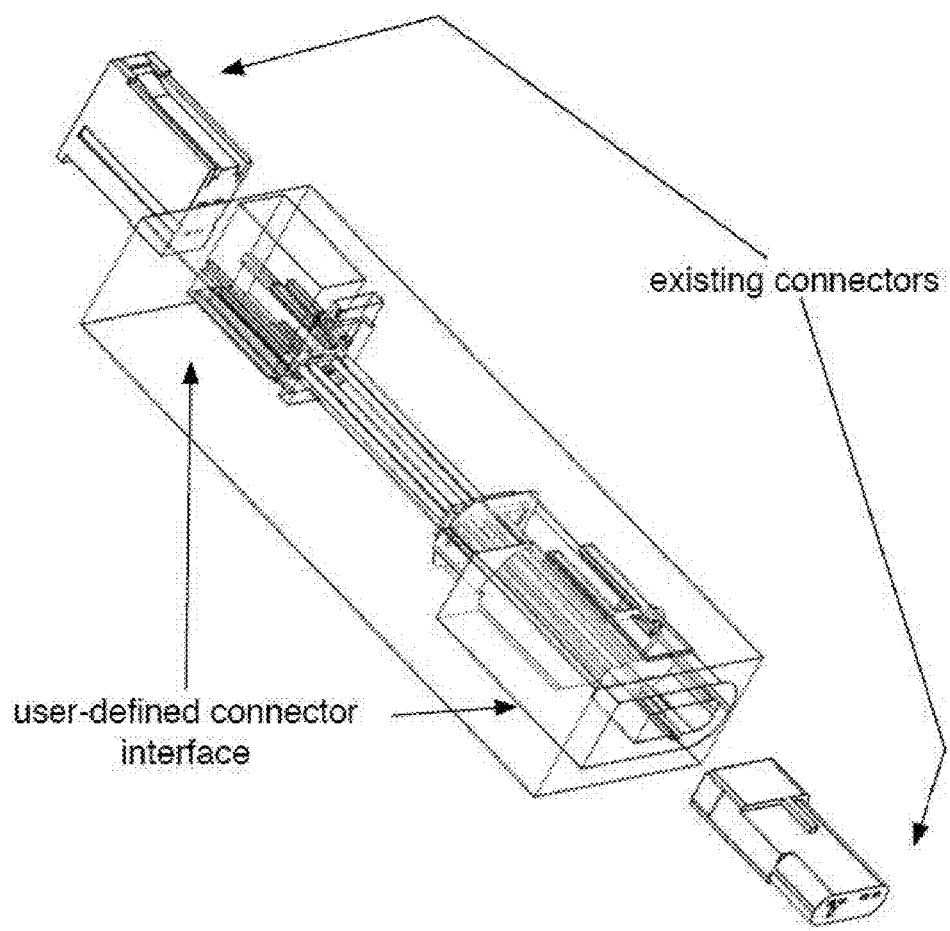
FIG. 9 is an example view of a substrate for electronics that are assembled in a modular fashion; in this example, a substrate for electronics that link two custom connectors to each other.

In a third application, the method assists in users creating custom adaptors between pre-existing electronic systems by allowing users to define their custom interconnect interfaces and to place those custom interfaces on a substrate. For example, a user can define an adaptor to interconnect two automotive subsystems. The user would define the body of the adaptor in a modeling tool (Step S120), then define the first custom automotive connector and place that on the body (Step 131) subject to placement rules (Step S110). The user then defines the second custom automotive connector and places that on the body (Step 131) subject to placement rules (Step S110), and requests the program to generate interconnect routings between the two custom interfaces (Step S140) and then prepare an STL file to send to a 3D printer (Step S150). An example substrate is as shown in FIG. 9.

The method is preferably performed at least in part in a 3D modeling application or tool operative on a computing device, but in some embodiments is additionally or alternatively performed in any suitable manner.

The substrates described herein are preferably 3D printed, but in some embodiments are additionally or alternatively fabricated by injection molding, CNC milling, waterjet cutting, or any other suitable manufacturing technique.

Modules are preferably user-replaceable, such that an electronic device is formed by a user placing modules into a substrate; additionally or alternatively, modules are integrated into the substrate during fabrication. If an inner module substrate is generated (Step 133), an electronic device is optionally formed by a user placing modules into the inner module substrate and then placing the combined inner module substrate and modules into the device's outer substrate; additionally, or alternatively, modules are integrated into the inner module substrate during fabrication.

The substrate is preferably compatible with a large range of module types. Modules preferably serve any function or purpose as long as they are capable of coupling to the substrate. A module is not necessarily limited to a particular hardware implementation or a physical electronic component. Modules are described, for example, by definition of the associated electrical connector, definition of the associated mechanical structure, and/or logic (e.g., in the form of semantic metadata) that specifies dependency relationships between the module and other modules from a group such as a library (e.g., a speaker requires a battery).

Some example module types include sensor modules, processor modules, storage modules, communication modules, display modules, and power modules. Examples of sensor modules include accelerometer modules, GPS modules, camera modules, depth imaging modules, fingerprint reader modules, biometric modules, microphone modules, digital/analog input modules, haptic input modules, infrared flash modules, pedometer modules, barometer modules, magnetometer modules, and gyroscope modules. Examples of processor modules include application processor modules and graphics processor modules. Examples of storage modules include flash memory modules and RAM modules. Examples of communication modules include Wi-Fi radio modules, GSM/CDMA radio modules, HDMI connector modules, NFC modules, Bluetooth radio modules, and USB connector modules. Examples of display modules include touchscreen LCD modules and e-ink display modules. Examples of power modules include battery modules, solar panel modules, and battery charging modules. Examples of extensible interconnects to other electronic systems include USB interfaces, automotive bus interfaces, SATA interfaces and other custom interconnects that can be specified by the user. Note that these example module types are in no way exhaustive or exclusive; i.e., modules optionally incorporate functionality from many of these example types or from none at all, and modules, additionally or alternatively, incorporate functionality not described herein.

The substrate is preferably able to take a wide variety of shapes and dimensions; this flexibility, combined with the varied capabilities of compatible modules and custom interfaces, preferably enables the creation of a large number of modular electronic devices (formed by coupling one or more modules with one or more substrates).

Step S110, in some embodiments, includes receiving and enforcing rulesets. Step S110 functions to load data relevant to substrate design and/or manufacturing constraints and use that data to guide the substrate design process. Step S110, in some embodiments, includes one or more of receiving a fabrication ruleset S111, enforcing the fabrication ruleset S112, receiving a material ruleset S113, enforcing the material ruleset S114, receiving a module ruleset S115, and enforcing the module ruleset S116. Step S110, in some embodiments, additionally or alternatively includes receiving and/or enforcing any rulesets or other constrain data relevant to substrate design.

In some embodiments, rulesets comprise manufacturing constraints. In further embodiments, the manufacturing constraints include both primary constraints (i.e., constraints inherent to the intermediate structure fabrication process) and/or secondary constraints (i.e., constraints relating to the conductive material injection process). In some embodiments, primary constraints differ based on the method of fabrication. Examples of primary constraints include vertical resolution of a layer-by-layer manufacturing process, planar resolution of a layer-by-layer manufacturing process, and tolerance variation from unit to unit of the manufacturing process. In some embodiments, secondary constraints include material constraints, structural constraints, and/or any other constraints on the intermediate structure fabrication process relevant to conductive material injection.

Some examples of material constraints include reactivity constraints (e.g., the material of the intermediate structure that comes into contact with the conductive material should not degrade or be degraded by the conductive material), thermal constraints (e.g., the material should have a substantially high glass transition temperature and heat deflection temperature that the intermediate structure does not deform or degrade either structurally or aesthetically during post-processing or conductive material injection and processing, and form and color of the material should stay controlled), and material mechanical constraints (e.g., the bulk material should not be mechanically deformed by conductive material injection). Other material constraints are, in some cases, induced by the properties of the intermediate structures (e.g. unprocessed material shall be clearable out of channels, if the intermediate structures are to be removed, then the material may permit the fine structure to be printed with mechanical properties that allow for clean removal of the structure). These constraints are given as example constraints. For example, in some cases, mechanical deformation of a cavity by the conductive material injection may be desirable. Further, different constraints may be desirable for different portions of the same structure; for example, conductive traces intended to carry different electrical signals may have different material and structural requirements.

Some examples of structural constraints include cavity dimension constraints, cavity access constraints, cavity radius of curvature constraints, cavity non-intersection constraints, and structural mechanical constraints. Such constraints may be selected based on the 3D object to be formed. For example, a cavity radius of curvature may require a portion of the 3D object to have a radius of curvature of at least about 0.1 meters.

In some embodiments, cavity dimension constraints include constraints on the minimum and maximum width of cavities, the minimum and maximum length of cavities. More generally, dimension constraints include, in various embodiments, any constraints on the cavity shape.

In some examples, cavity dimension constraints include constraints on the internal structure of cavities. For example, cavities constraints, in various embodiments, dictate that cavities have smooth circular walls, corrugated walls, internal planes, or internal attachments. Cavities may have any shape (whether irregular or irregular). Other example cavities are shown in FIGS. 7, 10A-10E, 11A-11D, and 12A-12C.

Figure 7:
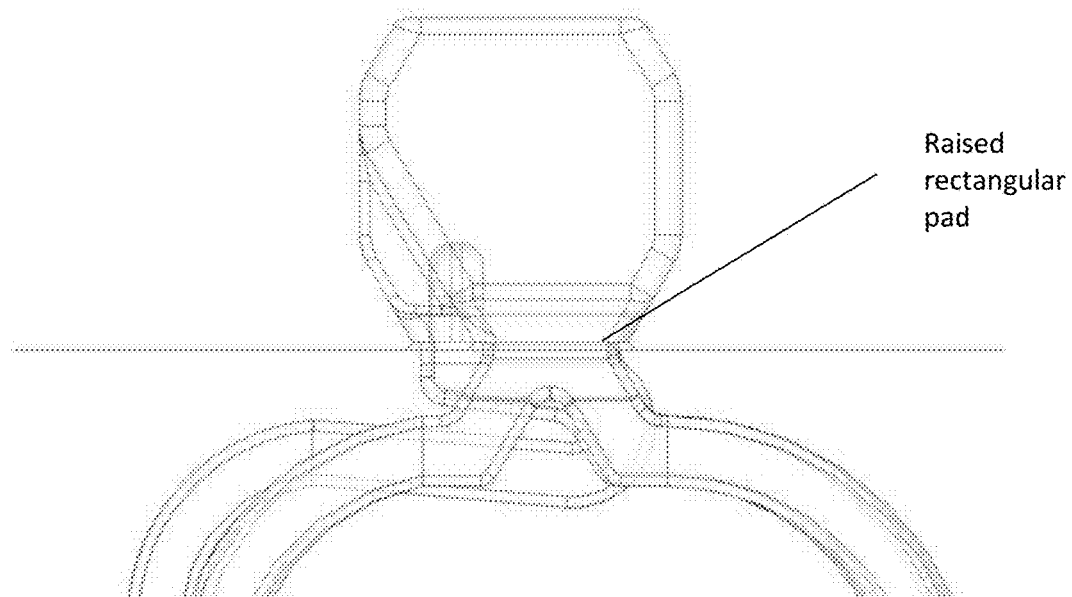
FIG. 7 is an example view of a contact pad of a substrate for electronics that are assembled in a modular fashion, in this example the contact pad is a raised rectangular pad.

In some embodiments, cavity dimension constraints are related to a number of other structure design considerations. For example, the roughness of cavity walls may play a role in how injected conductive material flows or coats the cavity walls. Additionally, cavity dimension constraints, in some embodiments, affect mechanical properties (e.g., stress, strain, rigidity) or electrical properties (e.g., resistance, inductance, and/or capacitance) of cavities and/or injected conductive material. In some embodiments, cavity dimensions additionally or alternatively affect interactions between cavities and injected conductive material (e.g., induced capillary forces, material flow resistance). For example, cavities near the surface of a contact pad may be shaped to increase contact surface area, as shown in FIG. 7. Such shapes are optionally circular, triangular, square, rectangular, or partial shapes or combinations thereof. Cavity dimensions may also affect the way unprocessed material is cleared out of channels (e.g., viscous photopolymer resins can have difficulty being evacuated from channels with too thin of a diameter). Also cavity dimensions constraints can be dictated by constraints of the fabrication process or the material (e.g., in some stereolythography machines, channels under 0.5 mm may have difficulty being printed).

FIG. 7 shows an example view of an intermediate structure. The intermediate structure has multiple cavities in fluid communication with a support structure for injection of a conductive material. A pad is formed after injection. The pad may provide a contact area, which may be used for electrical or thermal communication with other structures. The pad may be raised with respect to a surface of the intermediate structure. The pad may have various cross-sections, such as circular, triangular, square or rectangular. Although one pad is shown, the intermediate structure may have multiple pads with contact areas, such as at least 2, 3, 4, 5, 6, 7, 8, 9, 10 pads.

In some embodiments, cavity access constraints mandate that the intermediate structure has an opening for each cavity, enabling conductive material to be injected into the opening. This opening, for example, may be referred to as an injection port, although the opening may be used for purposes other than or in addition to injection. For example, an injection port may be used for access to cavities, injection of conductive material, ejection of conductive material, or any other use. Likewise, openings, in various embodiments, are designated as ejection ports (if intended for material ejection) or access ports (for other purposes).

The intermediate structure may have one opening that is in fluid communication with a channel. As an alternative, the intermediate structure optionally has at least 2, 3, 4, 5, 6, 7, 8, 9, 10, 20, 30, 40, or 50 openings, each in fluid communication with a channel or multiple channels. Such channel or multiple channels may permit injection, ejection or other access.

In some embodiments, cavity access constraints dictate that each cavity contains an injection port and an ejection port (e.g., ports dedicated to conductive material injection and ejection) and, in further embodiments, dictates the location of these ports dependent on a desired or given structure.

Additionally or alternatively, cavity access constraints may mandate that cavities of the intermediate structure have access points. For example, the cavity has a section near the surface of the intermediate structure where a drill or mill or any other operation that removes material from the three-dimensional structure can open an injection port in post-procession. These cavity access constraints may be directed to enabling conductive material injection. Cavity access constraints may also include constraints directed to functional aspects of the conductive material. For example, cavity access constraints may dictate that cavities are near the surface of the intermediate structure in places where electrical contact to the cavities is desired, or rather, the conductive material that will eventually fill the cavities is desired. This may extend to dictating local structural constraints in such areas, such as, e.g., requiring a raised contact pad (see, e.g., FIG. 7). Tabs, such those described in FIGS. 10A-10E, 11A-11D, and 12A-12C, are also an example of such structural constraints.

Cavity access constraints may be linked to cavity dimension constraints or other constraints. For example, cavity access points may have particular constraints regarding shape, size, position, orientation, or any other parameter related to the access points. For example, cavity access constraints may dictate that cavity injection ports are angled and have a larger diameter than the following section of cavity in order to better accommodate an injection syringe or to increase injection performance.

Cavity access constraints may also include dictating multiple injection (and/or ejection, or access) ports corresponding to different three-dimensional volumes of the intermediate structure. This may allow access to various parts of the intermediate structure. In some cases, these injection ports may be designed for temporary access. The ports may be closed or covered at some point after fabrication of the intermediate structure. Multiple injection ports corresponding to different three-dimensional planes or volumes may be arranged in a single plane or volume. For example, a structure may have four injection ports arranged in a plane that correspond to at least two separate planes inside the intermediate structure.

In some embodiments, cavity access constraints also include dictating, the shape, dimension, orientation, location and/or diameter of a channel to allow access and continuity of the channel inside an intermediate functional structure. In further embodiments, this includes, for example, removable tabs that allow for the creation of interconnects, removable tabs with injection of ejection ports, removable tab(s) that performs a splitting of two lines, and/or removable tab(s) with attachment fixture to monitor an injection operation.

In some embodiments, cavity radius of curvature constraints may include restrictions on the minimum radius of curvature of a cavity. In further embodiments, cavity non-intersection constraints include restrictions on the intersection of cavities with other cavities or with other conductive materials in the intermediate structure. For example, cavities intended to support conductive traces carrying separate electrical signals may require electrical isolation, which may in turn require that the cavities not intersect. This may permit the conductive traces to remain electrically isolated from one another. Structural mechanical constraints may include constraints on the physical structure of the intermediate structure. In some examples, it may be undesirable for the intermediate structure to be deformed by the conductive material injection process. In an example, cavity depth should be controlled in the material to prevent damage to the substrate during post-processing, as thin areas, created by a cavity close to the surface, can be prone to deformation, fracture or discoloration. Structural mechanical constraints may be distinct from material mechanical constraints in that structural mechanical constraints may depend on both material and structure (e.g., a material in bulk may meet constraints, while a mostly hollow lattice of the same material may not). Alternatively, structural mechanical constraints may not depend on material at all.

Step S110 preferably includes receiving rulesets at the beginning of a user-initiated substrate design process, but, in some embodiments, additionally or alternatively includes receiving rulesets at any suitable time. For example, in some embodiments, module rulesets are only be received after particular modules are selected by the user or when an inner module substrate is generated/updated (Step 133) by a user manipulating a module interface. Step S110 preferably includes receiving rulesets from a local ruleset database, but, in some embodiments, additionally or alternatively includes receiving rulesets from a remote ruleset database, from manual user input, or from any suitable source.

Step S110 preferably includes enforcing rulesets in real-time; for example, Step S110 preferably includes preventing a user from placing a module interface in a position that violates one or more rules. Additionally or alternatively, Step S110, in some embodiments, includes enforcing rulesets at any suitable time; for example, Step S110 optionally includes checking for rule violations immediately before finalizing substrate structure data. Step S110 preferably includes enforcing rulesets by not allowing a user to perform an action that violates rules; additionally or alternatively, Step S110, in some embodiments, includes allowing users to override rules by dismissing a rule violation or adjust ruleset tolerances to accept any existing rule violations.

Step S111, in some embodiments, includes receiving a fabrication ruleset. Step S111 functions to inform the design process of rules related to a particular fabrication technique or fabrication tool. Fabrication rulesets are preferably linked to particular fabrication methods; for example, a user may choose a fabrication ruleset to import to a design based on the 3D printer intended to print the final design. Fabrication rulesets may include rules directed to minimum resolution (e.g., the smallest design dimension must be greater than 0.1 mm), maximum size (e.g., the largest physical dimension must be smaller than 30 cm), material restrictions (e.g., a particular fabrication tool may only be compatible with a particular subset of available materials), or any other suitable rules. Fabrication rulesets are preferably directed to rules that constrain design, but fabrication rulesets may additionally or alternatively include rules directed to fabrication parameters (these rules may not be enforced until fabrication). For example, a fabrication ruleset may include a rule that sets printing speed of a 3D printer based on desired resolution—this rule may not directly affect design, but will affect later fabrication.

Figure 3:
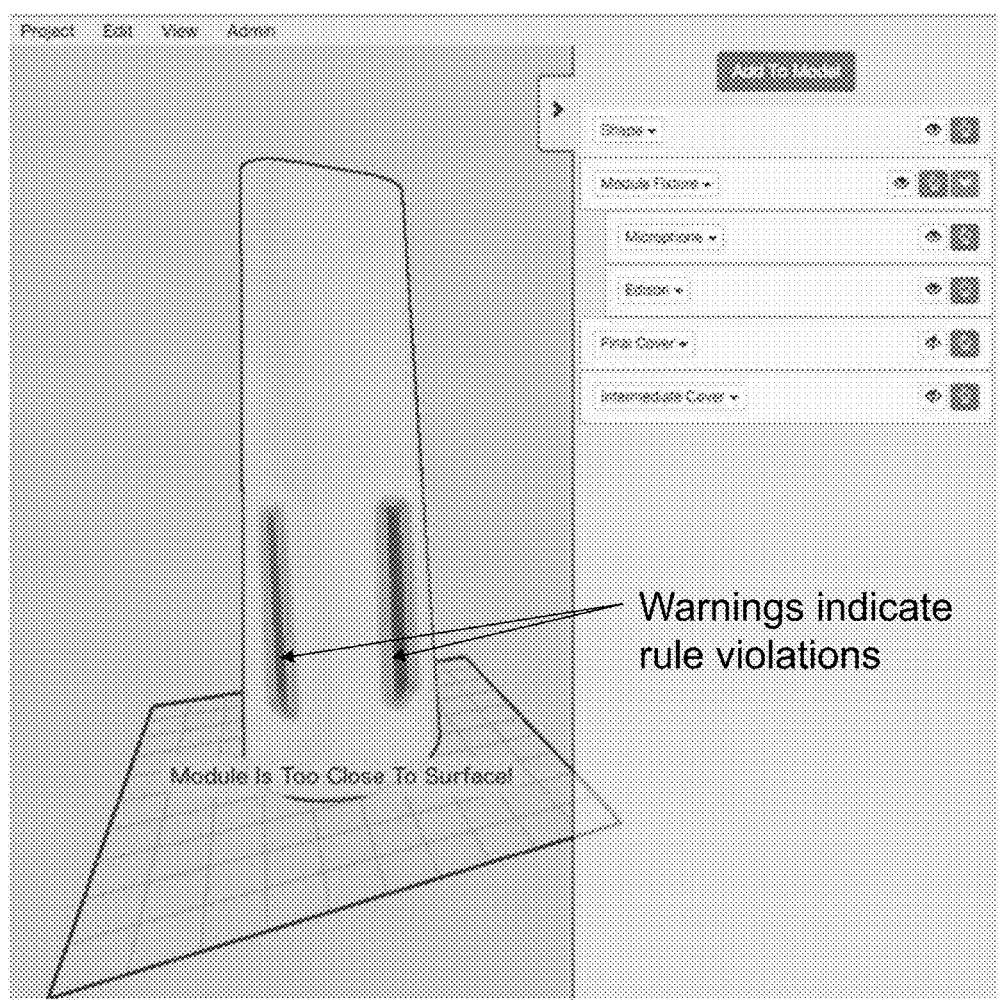
FIG. 3 is an example view, in the form of a screenshot of application interface, of a rule enforcement step of a method of an invention embodiment, in this example a rule that a module must be placed entirely within the substrate is enforced.

Step S112 includes enforcing the fabrication ruleset. Step S112 functions to prevent or discourage users from violating rules of the fabrication ruleset. Step S112 is preferably performed in real-time during reception of preliminary substrate structure data S120 and placing module interfaces S130, but may additionally or alternatively be performed at any time. Step S112 preferably includes preventing users from creating structures or placing module interfaces in such a way that fabrication rules would be violated; for example, Step S112 may include turning all or portions of a selected module interface from a neutral color to red and not allowing placement of the module interface in areas that cause a rule violation, as shown in FIG. 3, which depicts an exemplary screenshot of application interface. In FIG. 3, of a rule that a module must be placed entirely within the substrate is enforced and warnings are generated upon its violation by module placement.

Figure 4A:
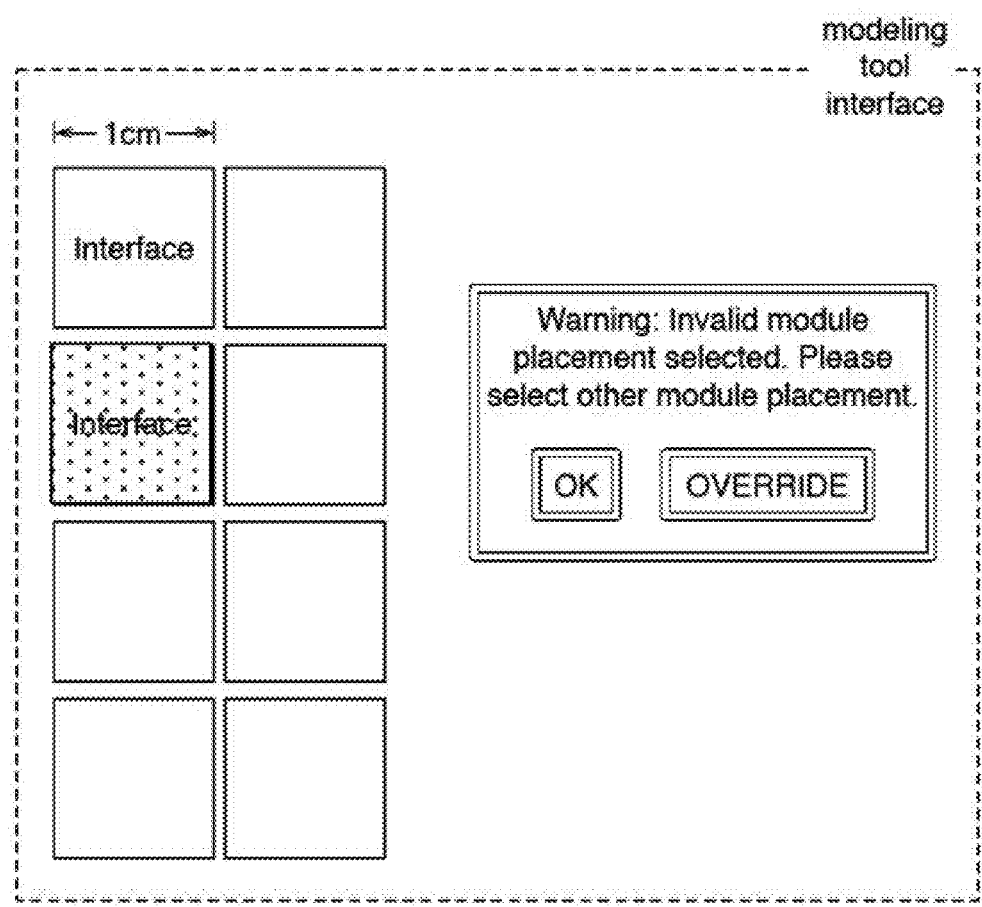
FIGS. 4A and 4B are example views of a rule enforcement step of a method of an invention embodiment including a warning and a warning override, in this example a rule that module interfaces must be separated by a particular distance is enforced, the views include a wireframe schematic (FIG. 4A) and a screenshot of an application interface (FIG. 4B)
Figure 4B:
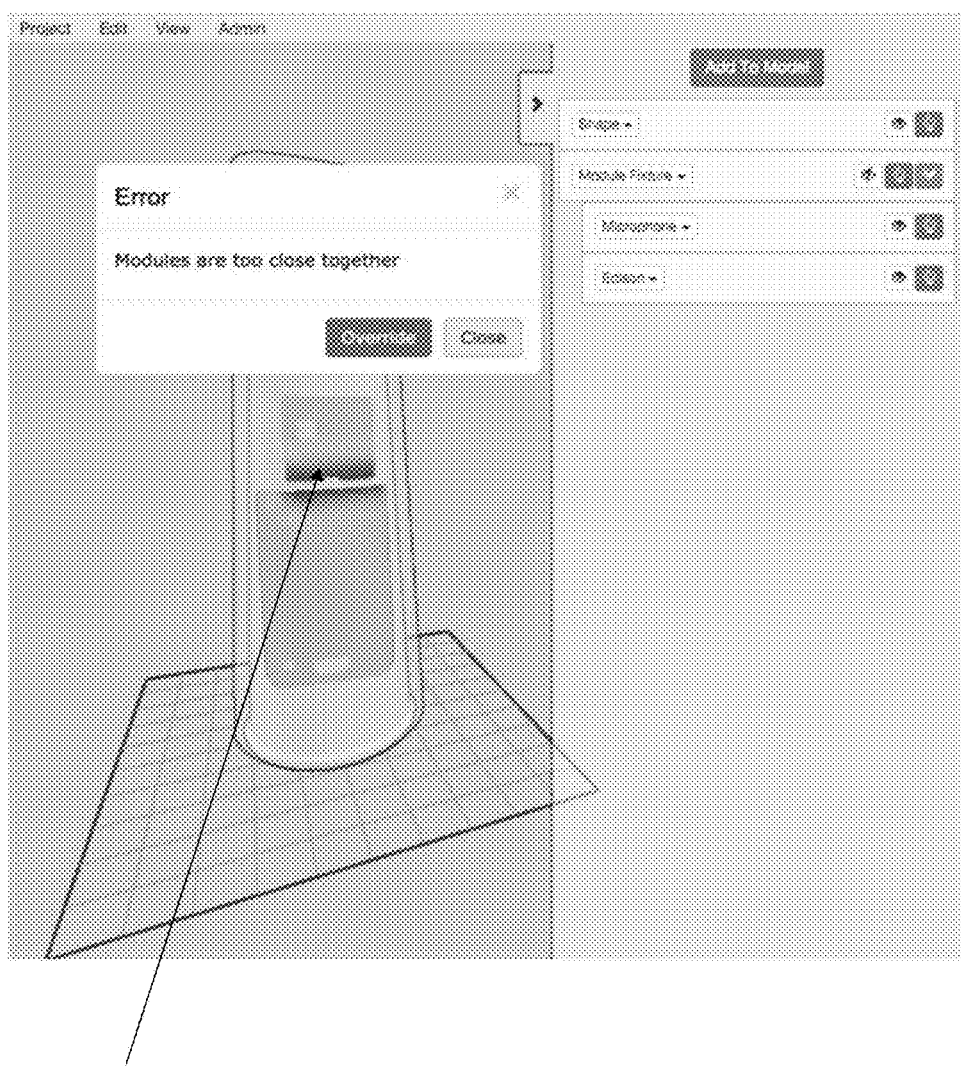

Additionally or alternatively, Step S112 may include warning users that an action has resulted or will result in a rule violation; for example, Step S112 may include allowing a user to place a module interface in an invalid location, but then popping up a warning screen or highlighting the offending module interface, as shown in FIGS. 4A and 4B. FIG. 4A depicts an exemplary wireframe of an application interface. In FIG. 4A, a rule that module interfaces must be separated by 1 cm is enforced and warnings are generated upon its violation by module placement. FIG. 4B depicts an exemplary screenshot of an application interface. In FIG. 4b, a rule that module interfaces must be separated by 5 mm is enforced and warnings are generated upon its violation by module placement. In these examples, a user optionally overrides the warning to allow the placement.

Step S113, in some embodiments, includes receiving a material ruleset. Step S113 functions to inform the design process of rules related to a particular fabrication material. Material rules may be independent of or dependent on fabrication rules (and vice versa); for example, material rules may include different minimum resolutions for a particular material for a first process and for a second process. Material rules may be related to structural aspects (e.g., resolution, aspect ratio, size, etc.) or to functional aspects (e.g., for a material to be used for conductive interconnects, it must meet some threshold conductivity). Material rules may relate to both structural and functional aspects simultaneously; for example, interconnects may be required to have a minimum cross-sectional area dependent on the conductivity of the interconnect material, such that the resistance per unit length is below some threshold. As with fabrication rulesets, material rulesets are preferably directed to rules that constrain design, but material rulesets may additionally or alternatively include rules directed to fabrication parameters (these rules may not be enforced until fabrication). For example, a particular material may require that printing speed of that material be limited to a particular value.

Step S114, in some embodiments, includes enforcing the material ruleset. Step S114 functions to prevent or discourage users from violating rules of the material ruleset. Step S114 is preferably performed in real-time during reception of preliminary substrate structure data S120 and placing module interfaces S130, but may additionally or alternatively be performed at any time. Step S114 preferably includes preventing users from creating structures or using materials in such a way that material rules would be violated, but in some embodiments additionally or alternatively includes warning users that an action has resulted or will result in a rule violation. Step S114 may include suggesting a different material if a substitution is available.

Step S115, in some embodiments, includes receiving a module ruleset. Step S115 functions to inform the design process of rules related to module interfaces and/or modules. Module rulesets may include rules directed to module connector placement (S115.1), module mechanical binding (S115.2), module semantic dependencies (S115.3), module/structure compatibility, module/material compatibility, and/or any suitable rules related to modules. Modules are optionally pre-defined and provided to users within a library, or they are defined by users of the system who specify their own connector interfaces (S115.1), mechanical binding (S115.2), and/or semantic dependencies (S115.3). For example, a module mechanical ruleset (S115.2) may include a rule that an interface intended for a speaker module must have a hollow cavity of some minimum dimensions behind the speaker module interface. As another example, a connector ruleset (S115.1) may include a rule that a custom interface intended for an automotive system interconnect should route GND to the first plate, supply voltage to the second plate, CLK signal to the third plate and SIGNAL to the fourth plate. As another example, a module semantic dependency ruleset (S115.3) may include a rule that placing a speaker module requires also placing a processor module and a power module.

Step S116, in some embodiments, includes enforcing the module ruleset. Step S116 functions to prevent or discourage users from violating rules of the module ruleset. Step S116 is preferably performed in real-time during placement of module interfaces S130, but in some embodiments is additionally or alternatively performed at any time. Step S116 preferably includes preventing users from using or placing modules in such a way that module rules would be violated, but in some embodiments additionally or alternatively includes warning users that an action has resulted or will result in a rule violation. Step S116 may include giving module suggestions if a particular module is required for a structure, or a module is required to be substituted out. Module rules enforced by Step S116, in some embodiments, are optionally defined in a library and provided in preexisting forms to users. Additionally or alternatively, module rules may be defined by users based on their own enforcement rules for connectors (S116.1), mechanical bindings (S116.2) and semantics (S116.3). For example, a custom connector ruleset (S116.1) may enforce the presence of a ground (GND) line for all other modules before it allows the addition of its associated module. As another example, a custom mechanical binding ruleset (S116.2) may enforce a particular depth in a substrate to attach properly to the male counterpart of an automotive connector before it allows the addition of its associated module. As yet another example, a custom semantic ruleset (S116.3) may provide battery options that are adequate for a speaker's power requirements before the speaker may be added.

Step S120, in some embodiments, includes receiving preliminary substrate structure data. Step S120 functions to define the preliminary substrate structure (i.e., the shape and volume of the substrate, not necessarily including interconnects and module interfaces). Step S120 preferably includes receiving substrate structure data in real-time at a 3D modeling tool (e.g., receiving substrate data includes receiving user input in a 3D modeling tool while the user designs the substrate structure), but may additionally or alternatively include receiving substrate structure data in any suitable manner (e.g., importing an automatically generated CAD file).

Step S120 preferably occurs before Steps S130 and S140, but may additionally or alternatively occur simultaneously or after Steps S130 and S140. For example, a user may place module interfaces in a 3D coordinate system first, generate interconnects, and then generate a substrate that structurally supports those interfaces. A user may also iteratively update a substrate and at any time, either explicitly or automatically, import the new substrate to satisfy ruleset violations, improve aesthetics, and/or improve module utility.

Step S120 preferably includes receiving manual design input (e.g., input defining substrate structure data) from a user, but may additionally or alternatively include designing some or all of substrate structure automatically. For example, Step S120 may allow a user to define a substrate volume and specify mechanical requirements, after which point the substrate volume is hollowed automatically (if such hollowing allows the structure to still meet mechanical requirements).

Step S120 preferably includes receiving design input from a user via a graphical interface of a voxel-based modeling tool. Design input is preferably received by the user selecting voxel sizes/shapes/materials and placing voxels in contact with each other; similarly to the way a structure might be built with plastic building blocks of different types, sizes, and colors. Design input may additionally or alternatively be received by users performing actions that automatically place voxels based on some criteria; for example, the user might fill a volume with voxels by defining the edges of the volume.

Figure 5:
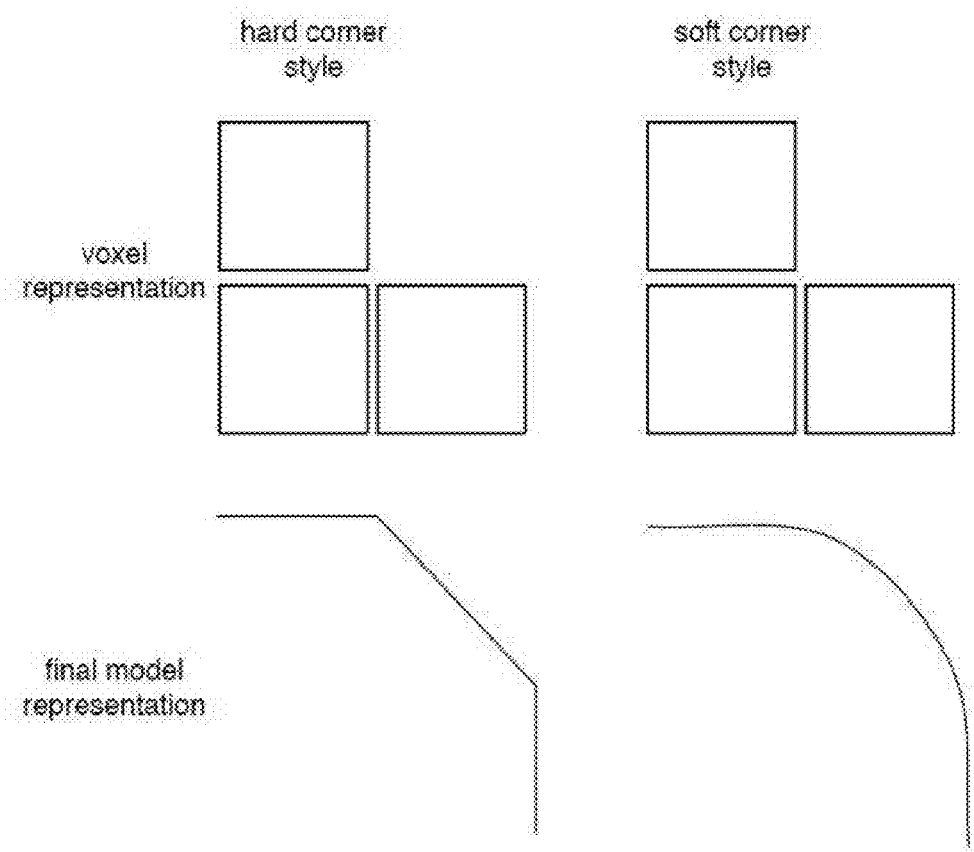
FIGS. 5 and 6 are example views of voxel styles, including voxel representations and corresponding final model representations.
Figure 6:
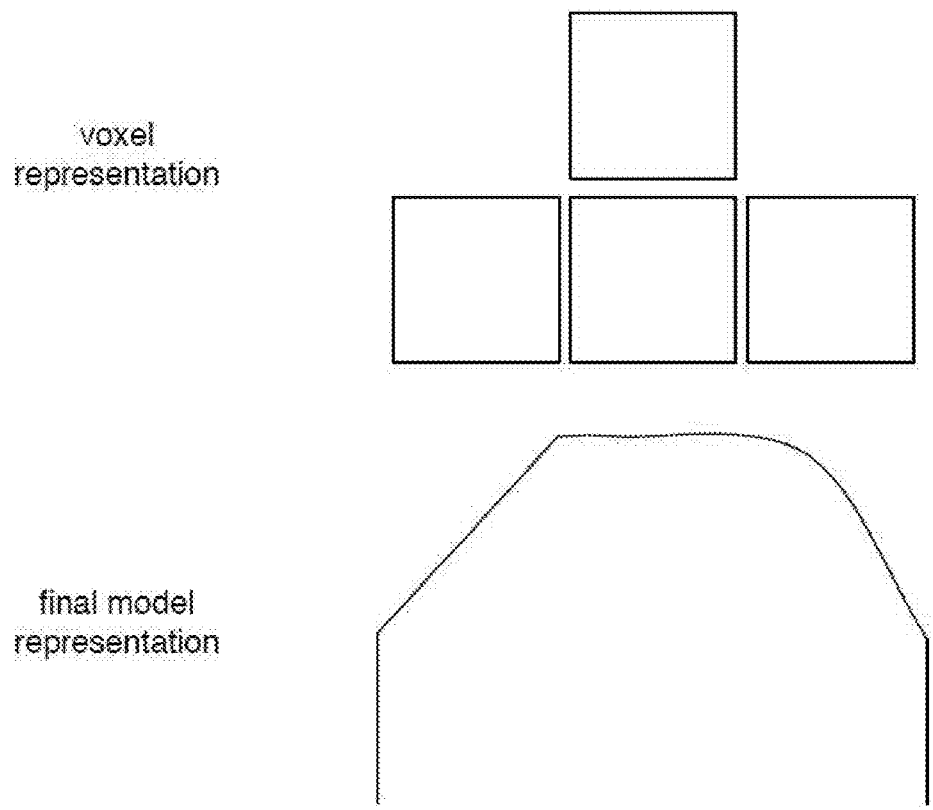

Voxels are preferably of dimensions substantially larger than minimum fabrication dimensions. Further, voxels are preferably linked to a final model representation (e.g., an STL file) based on voxel styles. Voxel styles represent different ways that voxels may be converted into a final model representation; that is, the voxel representation of a structure may serve as a rigging structure that uses various design rules to generate an implicit surface. For example, one voxel style (referred to as a "hard corner style") might dictate that voxels be converted to a final model representation by linearly interpolating between voxel vertices, while another voxel style (referred to as a "soft corner style") might dictate that voxels be converted to a final model representation by performing a smoothed linear interpolation between voxel vertices, as shown in FIG. 5. Voxel styles may be set for individual voxels, groups of voxels, or for voxel components; for example, the vertices on the left side of a voxel may have a different voxel style than the vertices on the right side, as shown in FIG. 6.

Conversion from voxel representation to final model representation is preferably accomplished through generation of sub-division surfaces, but may additionally or alternatively be accomplished in any suitable manner.

Step S130, in some embodiments, includes placing module interfaces. Step S130 functions to enable placement of interfaces that couple modules to each other through the substrate. Step S130 preferably includes placing module interfaces on surfaces of the preliminary substrate structure, but may additionally or alternatively include placing module interfaces in other locations. For example, a module interface may be placed outside of (and not contacting) the preliminary substrate structure; at some point later the preliminary substrate structure may be automatically or manually modified to incorporate the module interface into a surface of the preliminary substrate structure.

Step S130 preferably includes placing module interfaces linked to particular modules. For example, a user may select an LED module, which then allows the user to place a module interface of the correct size and contact type for the LED module. Additionally or alternatively, Step S130 may include placing a generic module interface; that is, a module interface with some size, shape, and contact type—but without a link to a specific module.

Step 130, in some embodiments, includes placing module interfaces beneath the surface of the substrate to improve electronic device aesthetics, module utility, and/or structural integrity. Placing one or more module interfaces beneath the surface of the substrate will either manually or automatically Step 133 to generate an inner module substrate. Such an inner module substrate will be generated such that its surface extends to the surface of all module interfaces and may be easily removed from and/or inserted into the outer substrate of the electronic device.

Figure 14A:
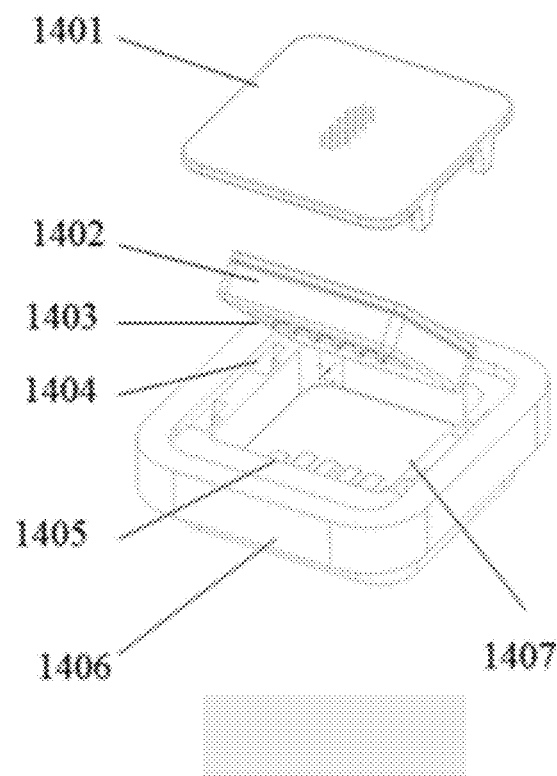
FIGS. 14A and 14B are example views of a module interface, the views include an exploded view of a printed substrate filled with conductive material with conductive material pads and mechanical docking features, self-contained circuitry, and a door for locking (FIG. 14A) and a view of the self-contained circuitry docked in the 3D printed substrate with the door locking mechanism inserted and spring finger contacts making contact with conductive material pads (FIG. 14B)
Figure 14B:
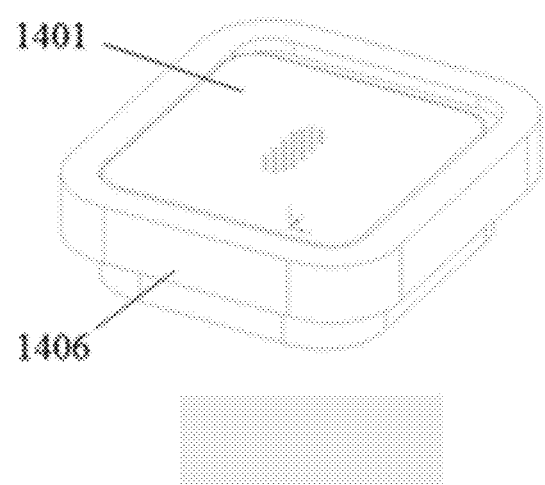

In this set, in some embodiments, the user selects for each module cavities that will welcome the module. Such a module in this case is comprised of electronic circuitry contained in injection-molded modules with male spring loaded connectors at their bottoms (e.g., pogo pins or spring fingers . . . ). The module is inserted in the cavity the connectors are in contact with interconnects location defined in the cavity. Mechanical attachment mechanisms are also defined along with the cavity to maintain the good connection of the module and the interconnect, such mechanisms are, by way of non-limiting examples, a bar flexure mechanism with a feature in the cavity to allow docking in the cavity, or latches on the side of the cavity to allow an injection molded door to slide and lock the module insert. Such a mechanism is presented in FIGS. 14A and 14B. FIG. 14A shows an example of an apparatus comprising a self-contained module making contact with conductive structures within a 3D printed object. The apparatus of the illustrated example includes a door 1401, self-contained circuitry 1402, spring-loaded connectors 1403, mechanical docking features 1404, conductive material pads 1405, a 3D printed substrate 1406 with a conductive structure, and a cavity for circuitry 1407. FIG. 14B shows the self-contained circuitry 1402 docked in the 3D printed substrate 1406 with door 1401 inserted. Here, spring-loaded connectors 1403 are making contact with conductive material pads 1405.

Module rulesets are preferably enforced in real-time (Step S116) during module placement, but additionally or alternatively, module placement may proceed without enforcement of module rulesets.

If module rulesets indicate particular requirements for a specific module type, those requirements may be automatically enforced. For example, if a speaker module requires a cavity at the back of the speaker module, the speaker module interface may be pre-coupled to the cavity (i.e., instead of placing the speaker module, and then having to make the cavity, placing the speaker module automatically places the cavity as well).

Module interfaces are preferably subtracted from existing surfaces; for example, placing a module interface on a flat surface results in the removal of some of that surface to form the interface. Additionally or alternatively, module interfaces may be added to existing surfaces (e.g., the module interface itself has a positive structure before placement).

In a variation of an invention embodiment, multiple module interfaces are associated with a module type. When a user places a module interface corresponding to the particular module type, the module interface is chosen based on the orientation and surface from the set of module interfaces associated with that module type. Additionally or alternatively, Step S130 may include rotating or otherwise shifting a placed module interface in order to better meet design criteria (for example, achieving an interconnect routing solution).

In some embodiments, users may specify their own module placements by defining a connector interface (placed at step S131), and/or mechanical binding interface (placed at step S132). These user-defined interfaces may be automatically enforced by the program. For example, the user may define a custom automotive connector that has two connectors and a particular depth, e.g., as specified by an automotive standard. At Step S132, this particular depth is subtracted from the substrate or added to the substrate based on its design. At Step S131, the connector interface is added to the substrate or subtracted from the substrate based on its design. The information about how to carry out custom interconnect routing may be passed to Step S140 from Step S131.

Step S140, in some embodiments, includes generating interconnect routing data. Step S140 functions to modify substrate structure data to include conductive traces between module interfaces placed in Step S130.

Step S140 preferably occurs simultaneously with Step S130—that is, after a module is placed, the substrate structure data is preferably modified to include conductive traces between the module and other modules. Additionally or alternatively, Step S140 may occur after all modules are placed, or at any suitable time.

Step S140 preferably determines interconnect routing using an A* path-finding algorithm designed to connect nodes (e.g., contact pads or pins of a module interface), but in some embodiments additionally or alternatively includes determining interconnect routing using any suitable algorithm. Connections between nodes (i.e., which pins of module A connect to which pins of module B and so on) are preferably determined automatically as part of Step S140 based on module rulesets. Additionally or alternatively, connections between nodes may be determined in part or in whole by user input. For example, a user may manipulate a schematic diagram of the modules in the modeling tool in order to change the interconnect routing of Step S140 (which is preferably updated in real-time as module interfaces are moved).

Interconnects preferably obey configuration rules received and enforced by Step S110; such rules may include rules that interconnects do not intersect, interconnects have a radius of curvature above some minimum threshold, etc.

Step S140 preferably performs interconnect routing based on the method of fabrication by which interconnects will be created. In some cases, interconnect fabrication is substantially similar to structure fabrication (e.g., interconnects are fabricated as part of a 3D printing process, simply using different materials). In other cases, interconnect fabrication may be substantially different than structure fabrication— this difference is preferably reflected in the interconnect routing process.

In one example, interconnects are fabricated by the injection of conductive material into cavities within the substrate. This method of fabrication, preferably substantially similar to that of U.S. Provisional Application No. 62/067,674, which is incorporated in its entirety by this reference, involves 3D printing (or otherwise manufacturing) a substrate with injection-port accessible cavities. A liquid/paste conductive material is injected into the cavities, and then cured-creating conductive wires within the substrate. In this example, Step S140 would include generating the cavities needed for the conductive wires, including injection ports and structure required for any contact pads.

For fabrication methods similar to this injection method, Step S140 preferably includes routing cavities such that the cavities do not intersect, and the cavities are accessible for contact at module interface ports. For example, Step S140 may include routing cavities near the surface of a raised contact pad of a module interface, so that the contact pad may be milled in order to expose the raised contact pad, as shown in FIG. 7.

In alternative embodiments, step S140 includes the placement of intermediate structure such as functional tabs and cavities with predetermined structural constrains ensembles that are added locally at the beginning, at the end or at an arbitrary number of locations along the length of a cavity. Such cavities may allow the creation of injection ports, contact pads, exit ports, fixturing or any other structure required either by the manufacturing process or defined by the user. The cavity and tab design allow the creation of high quality contacts arranged in an array by raising locally the cavity and changing its geometry to have an optimal contact area vs. cross section. The fracture of the base of the tab allows revealing the connector pad. If the cavity is routed through the removable portion of the structure, the fracture can then remove part of the length of the cavity, creating a break in a line, thus allowing the isolation of two portions of that line. Such geometry is presented in FIGS. 10A-10E.

FIG. 10A shows an exemplary temporary intermediate structure unfilled. FIG. 10B shows the temporary intermediate structure filled. FIG. 10C illustrates that a tab can be broken off by the operator by applying force on the tab to generate a controlled fracture at the base; conductive material is removed between two pads, which creates a break in the line. FIGS. 10D and 10E show that removal of the temporary intermediate structure leaves rectangular pads and isolated lines (side view D and iso view E).

The cavity geometry can be constrained in the tab to allow the docking and fixturing of injection or monitoring apparatus, allowing the connection to an injection pump or syringe (see FIGS. 11A-11D, showing example views of temporary intermediate structures). FIG. 11A depicts an exemplary side view showing an injection port wherein the injection structure is unfilled. FIG. 11B depicts an exemplary iso view showing the injection port. FIG. 11C depicts the iso view of FIG. 11B with the injection structure filled. FIG. 11D depicts the iso view of FIG. 11C with the injection structure filled and with tabs removed and contacts created.

Figure 12A:
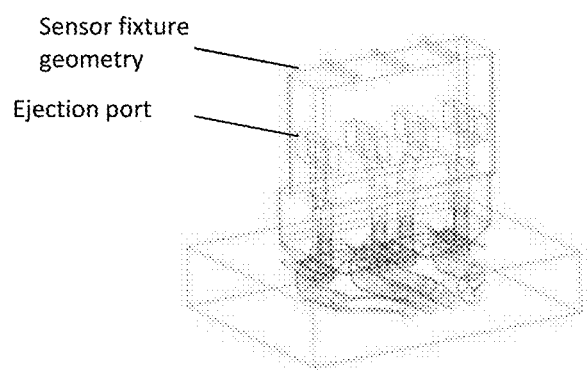
FIGS. 12A-12C are example views of temporary intermediate structures generated in S140, the views include an iso view of an ejection structure including sensor fixture geometry and ejection ports (FIG. 12A), a side view of the ejection structure (FIG. 12B), and a side view of the ejection structure fixtured with OMRON EE-SX770 photomicrosensor used to detect the presence of conductive material at the end of a cavity during the injection process (FIG. 12C)
Figure 12B:
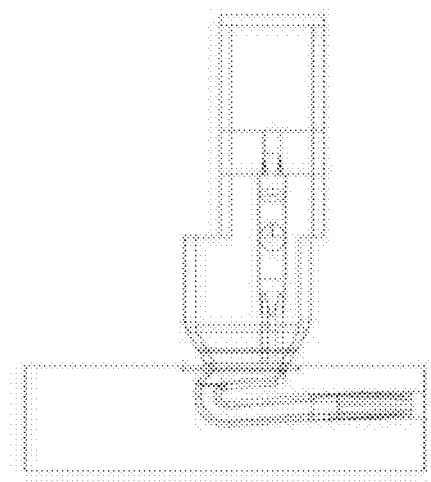
Figure 12C:
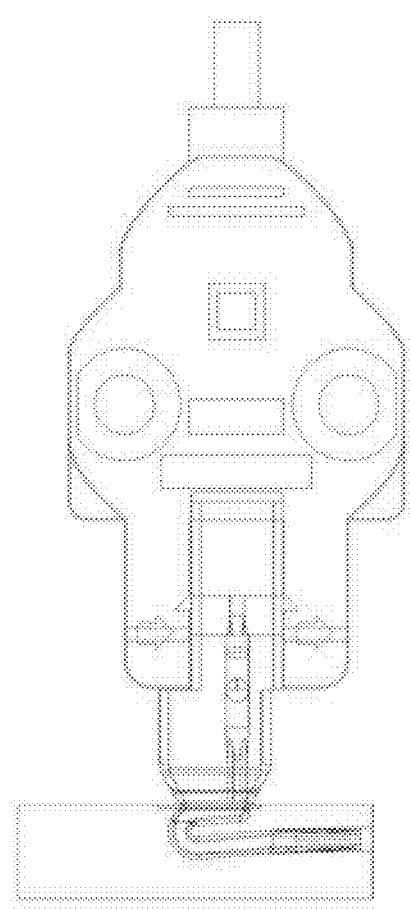

Additionally the geometry of the tab itself is designed to allow handling by either the hand of an operator, a tool or any other apparatus, either for processing or to attach sensors (see FIGS. 12A-12C, showing example views of temporary intermediate structures). FIG. 12A depicts an exemplary iso view of an ejection structure including sensor fixture geometry and ejection ports. FIG. 12B depicts a side view of the ejection structure. FIG. 12C depicts a side view of the ejection structure fixtured with an OMRON EE-SX770 photomicrosensor used to detect the presence of conductive material at the end of a cavity during the injection process. Step S140 may also include routing cavities according any of the other secondary constraints of U.S. Provisional Application No. 62/067,674.

Step S140, in some embodiments, additionally includes generating circuits S141. Step S141 functions to create circuit components (which may be either be connected to a single interconnect or may couple multiple interconnects) from conductive material in the fabrication process. Circuit components are preferably created using a modification of the fabrication process used for interconnect creation, but may additionally or alternatively be fabricated in any suitable way. For example, a resistor may be fabricated by changing the composition of conductive material used for interconnects or by changing the shape of interconnects (e.g., making a section with a small cross-sectional area). Circuit components are preferably placed similarly to module interfaces (e.g., by users, selecting a particular circuit) but may additionally or alternatively be placed automatically (e.g., particular module interfaces automatically place particular circuit components in serial with particular interconnects) or manually (e.g., by altering interconnect routing parameters).

Figure 13A:
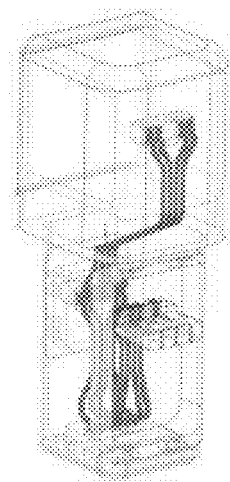
FIGS. 13A-13F are example views of a finalized substrate fabricated in S160 of FIG. 1, the views include an iso view of the substrate filled with conductive material and with temporary structures (FIG. 13A), an iso view of the substrate filled with conductive material and with temporary structures removed (FIG. 13B), a side view of the substrate filled with conductive material and with temporary structures removed (FIG. 13C), a front view of the substrate filled with conductive material and with temporary structures removed (FIG. 13D), a solid iso view of the 3D printed substrate with connector pads apparent (FIG. 13E), and a solid front view of the 3D printed substrate with connector pads apparent (FIG. 13F)
Figure 13B:
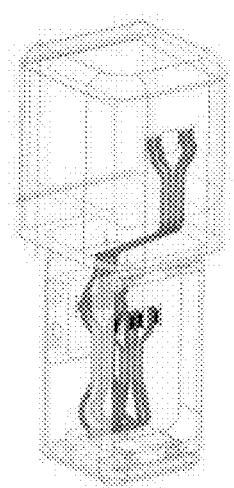
Figure 13C:
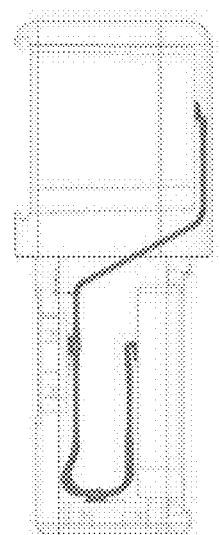
Figure 13D:
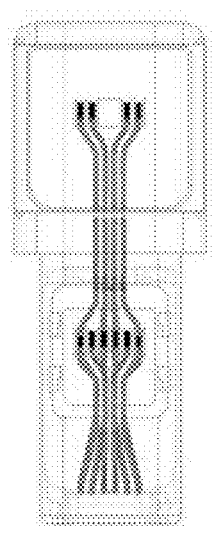
Figure 13E:
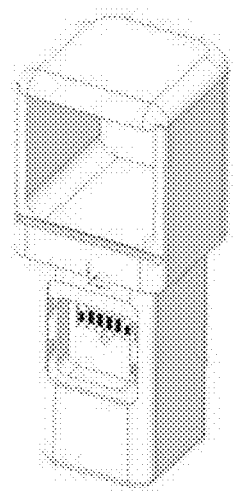
Figure 13F:
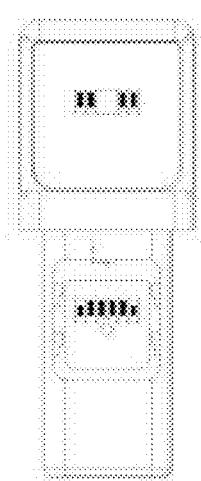

Step S150, in some embodiments, includes finalizing substrate structure data. Step S150 functions to combine the preliminary substrate structure data with module placement data and interconnect routing data to generate one or more finalized substrate models, as seen in FIGS. 13A-13F, which show example views of a finalized fabricated substrate. FIG. 13A depicts an iso view of a substrate filled with conductive material and with temporary structures intact. FIG. 13B depicts an iso view of the substrate filled with conductive material and with the temporary structures removed. FIG. 13C depicts a side view of the substrate filled with conductive material and with the temporary structures removed. FIG. 13D depicts a front view of the substrate filled with conductive material and with the temporary structures removed to form connector pads. FIG. 13E depicts a solid iso view of the 3D printed substrate with the connector pads apparent. FIG. 13F depicts a solid front view of the 3D printed substrate with the connector pads apparent.

Step S150 may additionally or alternatively include converting the voxel-based representation of the preliminary substrate structure data (and/or module placement data, interconnect routing data) to a manufacturing format (e.g., STL). Step S150 preferably includes generating the finalized substrate model based on user parameters; for example, voxel styles or conversion parameters (i.e., parameters specifically directed to the conversion from one model format to another). Conversion parameters might include a mesh resolution, for example.

Figure 15A:
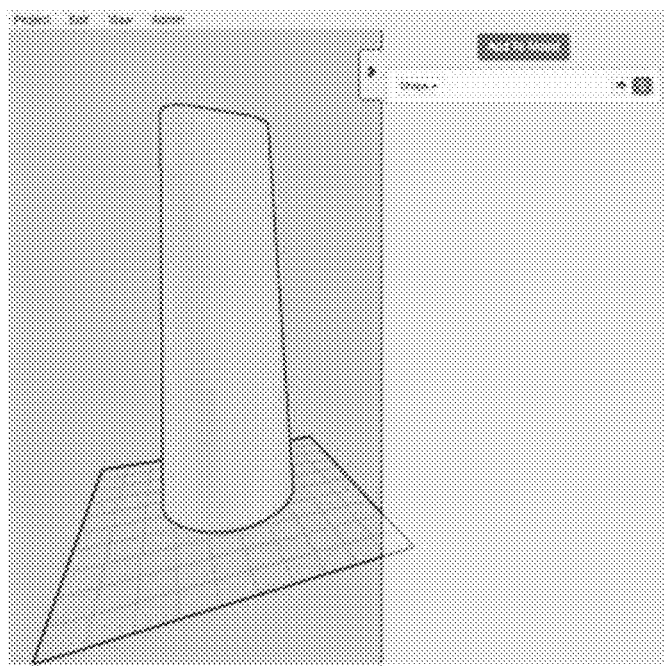
FIG. 15A is an example view, in the form of an application interface screenshot, of imported preliminary substrate structure data (S120 of FIG. 1)
Figure 15B:
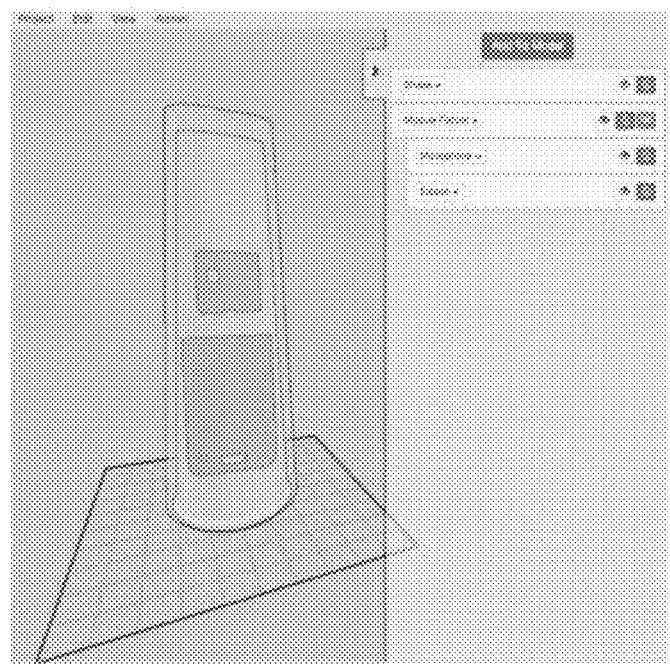
FIG. 15B is an example view, in the form of an application interface screenshot, of placed module interfaces (S130 of FIG. 1) and a generated inner module substrate (S133 of FIG. 1)

If modules have been placed beneath the surface of the external substrate, Step 150 may include manipulation of the exterior substrate model to improve utility of module interfaces beneath the surface of the external substrate. For example, a microphone placed beneath the surface of the external substrate may require holes placed in the external substrate to facilitate sound propagation to the microphone sensor as seen in FIGS. 15A and 15B. This manipulation of the exterior substrate may be applied manually be the user or applied automatically based on module rulesets, module libraries, or other sources.

Step S160, in some embodiments, includes fabricating the finalized substrate. Step S160 functions to convert the finalized substrate model into a substrate. In some embodiments, Step S160 includes transmitting, sending, or communicating instructions to a computer-controlled manufacturing tool, apparatus, or system. In further embodiments, the instructions cause the computer-controlled manufacturing tool, apparatus, or system to fabricate finalized substrate to create the 3D electronic product.

Step S160 preferably includes 3D printing the substrate using an SLA method (wherein cavities are printed instead of interconnects) and then injecting the cavities with a conductive material to form the final substrate. Step S160 may additionally or alternatively include fabricating the finalized substrate using extrusion techniques (e.g., fused deposition modeling), granular techniques (e.g., laser sintering), powder bed techniques, inkjet head techniques, laminated object manufacturing techniques, any other additive manufacturing techniques and/or using any suitable technique or combination of techniques. If an inner module substrate has been generated (Step 133), Step 160 may additionally or alternatively include different fabrication techniques for the inner module substrate and outer substrates. For example, choice of inner module substrate fabrication materials and techniques may be influenced by material rulesets of the injecting of conductive materials process, but the fabrication materials and techniques of the outer substrate may be determined based on cost effectiveness and/or aesthetics of the exterior surface.

As a person skilled in the art will recognize from the previous detailed description and from the figures and claims, modifications and changes can be made to the invention embodiments of the invention without departing from the scope of this invention defined in the following claims.

Digital Processing Device

In some embodiments, the systems, media, and methods described herein include a digital processing device, or use of the same. In further embodiments, the digital processing device includes one or more hardware central processing units (CPUs) or general purpose graphics processing units (GPGPUs) that carry out the device's functions. In still further embodiments, the digital processing device further comprises an operating system configured to perform executable instructions. In some embodiments, the digital processing device is optionally connected a computer network. In further embodiments, the digital processing device is optionally connected to the Internet such that it accesses the World Wide Web. In still further embodiments, the digital processing device is optionally connected to a cloud computing infrastructure. In other embodiments, the digital processing device is optionally connected to an intranet. In other embodiments, the digital processing device is optionally connected to a data storage device.

In accordance with the description herein, suitable digital processing devices include, by way of non-limiting examples, server computers, desktop computers, laptop computers, notebook computers, sub-notebook computers, netbook computers, netpad computers, set-top computers, media streaming devices, handheld computers, Internet appliances, mobile smartphones, tablet computers, personal digital assistants, video game consoles, and vehicles. Those of skill in the art will recognize that many smartphones are suitable for use in the system described herein. Those of skill in the art will also recognize that select televisions, video players, and digital music players with optional computer network connectivity are suitable for use in the system described herein. Suitable tablet computers include those with booklet, slate, and convertible configurations, known to those of skill in the art.

In some embodiments, the digital processing device includes an operating system configured to perform executable instructions. The operating system is, for example, software, including programs and data, which manages the device's hardware and provides services for execution of applications. Those of skill in the art will recognize that suitable server operating systems include, by way of non-limiting examples, FreeBSD, OpenBSD, NetBSD®, Linux, Apple® Mac OS X Server®, Oracle® Solaris®, Windows Server®, and Novell® NetWare®. Those of skill in the art will recognize that suitable personal computer operating systems include, by way of non-limiting examples, Microsoft® Windows®, Apple® Mac OS X®, UNIX®, and UNIX-like operating systems such as GNU/Linux®. In some embodiments, the operating system is provided by cloud computing. Those of skill in the art will also recognize that suitable mobile smart phone operating systems include, by way of non-limiting examples, Nokia® Symbian® OS, Apple® iOS®, Research In Motion® BlackBerry OS®, Google® Android®, Microsoft® Windows Phone® OS, Microsoft® Windows Mobile® OS, Linux®, and Palm WebOS®. Those of skill in the art will also recognize that suitable media streaming device operating systems include, by way of non-limiting examples, Apple TV®, Roku®, Boxee®, Google TV®, Google Chromecast®, Amazon Fire®, and Samsung® HomeSync®. Those of skill in the art will also recognize that suitable video game console operating systems include, by way of non-limiting examples, Sony® PS3®, Sony® PS4®, Microsoft Xbox 360®, Microsoft Xbox One, Nintendo® Wii®, Nintendo® Wii U®, and Ouya®.

In some embodiments, the device includes a storage and/or memory device. The storage and/or memory device is one or more physical apparatuses used to store data or programs on a temporary or permanent basis. In some embodiments, the device is volatile memory and requires power to maintain stored information. In some embodiments, the device is non-volatile memory and retains stored information when the digital processing device is not powered. In further embodiments, the non-volatile memory comprises flash memory. In some embodiments, the non-volatile memory comprises dynamic random-access memory (DRAM). In some embodiments, the non-volatile memory comprises ferroelectric random access memory (FRAM). In some embodiments, the non-volatile memory comprises phase-change random access memory (PRAM). In other embodiments, the device is a storage device including, by way of non-limiting examples, CD-ROMs, DVDs, flash memory devices, magnetic disk drives, magnetic tapes drives, optical disk drives, and cloud computing based storage. In further embodiments, the storage and/or memory device is a combination of devices such as those disclosed herein.

In some embodiments, the digital processing device includes a display to send visual information to a user. In some embodiments, the display is a cathode ray tube (CRT). In some embodiments, the display is a liquid crystal display (LCD). In further embodiments, the display is a thin film transistor liquid crystal display (TFT-LCD). In some embodiments, the display is an organic light emitting diode (OLED) display. In various further embodiments, on OLED display is a passive-matrix OLED (PMOLED) or active-matrix OLED (AMOLED) display. In some embodiments, the display is a plasma display. In other embodiments, the display is a video projector. In still further embodiments, the display is a combination of devices such as those disclosed herein.

In some embodiments, the digital processing device includes an input device to receive information from a user. In some embodiments, the input device is a keyboard. In some embodiments, the input device is a pointing device including, by way of non-limiting examples, a mouse, trackball, track pad, joystick, game controller, or stylus. In some embodiments, the input device is a touch screen or a multi-touch screen. In other embodiments, the input device is a microphone to capture voice or other sound input. In other embodiments, the input device is a video camera or other sensor to capture motion or visual input. In further embodiments, the input device is a Kinect, Leap Motion, or the like. In still further embodiments, the input device is a combination of devices such as those disclosed herein.

Non-Transitory Computer Readable Storage Medium

The methods of the invention embodiments and variations thereof can be embodied and/or implemented at least in part as a machine configured to receive a computer-readable medium storing computer-readable instructions. The instructions are preferably executed by computer-executable components preferably integrated with a 3D printer or other computer-controlled manufacturing tool. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

In some embodiments, the systems, media, and methods disclosed herein include one or more non-transitory computer readable storage media encoded with a program including instructions executable by the operating system of an optionally networked digital processing device. In further embodiments, a computer readable storage medium is a tangible component of a digital processing device. In still further embodiments, a computer readable storage medium is optionally removable from a digital processing device. In some embodiments, a computer readable storage medium includes, by way of non-limiting examples, CD-ROMs, DVDs, flash memory devices, solid state memory, magnetic disk drives, magnetic tape drives, optical disk drives, cloud computing systems and services, and the like. In some cases, the program and instructions are permanently, substantially permanently, semi-permanently, or non-transitorily encoded on the media.

Computer Program

In some embodiments, the systems, media, and methods disclosed herein include at least one computer program, or use of the same. A computer program includes a sequence of instructions, executable in the digital processing device's CPU, written to perform a specified task. Computer readable instructions may be implemented as program modules, such as functions, objects, Application Programming Interfaces (APIs), data structures, and the like, that perform particular tasks or implement particular abstract data types. In light of the disclosure provided herein, those of skill in the art will recognize that a computer program may be written in various versions of various languages.

The functionality of the computer readable instructions may be combined or distributed as desired in various environments. In some embodiments, a computer program comprises one sequence of instructions. In some embodiments, a computer program comprises a plurality of sequences of instructions. In some embodiments, a computer program is provided from one location. In other embodiments, a computer program is provided from a plurality of locations. In various embodiments, a computer program includes one or more software modules. In various embodiments, a computer program includes, in part or in whole, one or more web applications, one or more mobile applications, one or more standalone applications, one or more web browser plug-ins, extensions, add-ins, or add-ons, or combinations thereof.

Web Application

In some embodiments, a computer program includes a web application. In light of the disclosure provided herein, those of skill in the art will recognize that a web application, in various embodiments, utilizes one or more software frameworks and one or more database systems. In some embodiments, a web application is created upon a software framework such as Microsoft® .NET or Ruby on Rails (RoR). In some embodiments, a web application utilizes one or more database systems including, by way of non-limiting examples, relational, non-relational, object oriented, associative, and XML database systems. In further embodiments, suitable relational database systems include, by way of non-limiting examples, Microsoft® SQL Server, mySQL™, and Oracle®. Those of skill in the art will also recognize that a web application, in various embodiments, is written in one or more versions of one or more languages. A web application may be written in one or more markup languages, presentation definition languages, client-side scripting languages, server-side coding languages, database query languages, or combinations thereof. In some embodiments, a web application is written to some extent in a markup language such as Hypertext Markup Language (HTML), Extensible Hypertext Markup Language (XHTML), or eXtensible Markup Language (XML). In some embodiments, a web application is written to some extent in a presentation definition language such as Cascading Style Sheets (CSS). In some embodiments, a web application is written to some extent in a client-side scripting language such as Asynchronous Javascript and XML (AJAX), Flash® Actionscript, Javascript, or Silverlight®. In some embodiments, a web application is written to some extent in a server-side coding language such as Active Server Pages (ASP), ColdFusion®, Perl, Java™, JavaServer Pages (JSP), Hypertext Preprocessor (PHP), Python™, Ruby, Tcl, Smalltalk, WebDNA®, or Groovy. In some embodiments, a web application is written to some extent in a database query language such as Structured Query Language (SQL). In some embodiments, a web application integrates enterprise server products such as IBM® Lotus Domino®. In some embodiments, a web application includes a media player element. In various further embodiments, a media player element utilizes one or more of many suitable multimedia technologies including, by way of non-limiting examples, Adobe® Flash®, HTML 5, Apple® QuickTime®, Microsoft® Silverlight®, Java™, and Unity®.

Mobile Application

In some embodiments, a computer program includes a mobile application provided to a mobile digital processing device. In some embodiments, the mobile application is provided to a mobile digital processing device at the time it is manufactured. In other embodiments, the mobile application is provided to a mobile digital processing device via the computer network described herein.

In view of the disclosure provided herein, a mobile application is created by techniques known to those of skill in the art using hardware, languages, and development environments known to the art. Those of skill in the art will recognize that mobile applications are written in several languages. Suitable programming languages include, by way of non-limiting examples, C, C++, C#, Objective-C, Java™, Javascript, Pascal, Object Pascal, Python™, Ruby, VB.NET, WML, and XHTML/HTML with or without CSS, or combinations thereof.

Suitable mobile application development environments are available from several sources. Commercially available development environments include, by way of non-limiting examples, AirplaySDK, alcheMo, Appcelerator®, Celsius, Bedrock, Flash Lite, .NET Compact Framework, Rhomobile, and WorkLight Mobile Platform. Other development environments are available without cost including, by way of non-limiting examples, Lazarus, MobiFlex, MoSync, and Phonegap. Also, mobile device manufacturers distribute software developer kits including, by way of non-limiting examples, iPhone and iPad (iOS) SDK, Android™ SDK, BlackBerry® SDK, BREW SDK, Palm® OS SDK, Symbian SDK, webOS SDK, and Windows® Mobile SDK.

Those of skill in the art will recognize that several commercial forums are available for distribution of mobile applications including, by way of non-limiting examples, Apple® App Store, Google® Play, Chrome WebStore, BlackBerry® App World, App Store for Palm devices, App Catalog for webOS, Windows® Marketplace for Mobile, Ovi Store for Nokia® devices, Samsung® Apps, and Nintendo® DSi Shop.

Standalone Application

In some embodiments, a computer program includes a standalone application, which is a program that is run as an independent computer process, not an add-on to an existing process, e.g., not a plug-in. Those of skill in the art will recognize that standalone applications are often compiled. A compiler is a computer program(s) that transforms source code written in a programming language into binary object code such as assembly language or machine code. Suitable compiled programming languages include, by way of non-limiting examples, C, C++, Objective-C, COBOL, Delphi, Eiffel, Java™, Lisp, Python™, Visual Basic, and VB .NET, or combinations thereof. Compilation is often performed, at least in part, to create an executable program. In some embodiments, a computer program includes one or more executable complied applications.

Web Browser Plug-In

In some embodiments, the computer program includes a web browser plug-in (e.g., extension, etc.). In computing, a plug-in is one or more software components that add specific functionality to a larger software application. Makers of software applications support plug-ins to enable third-party developers to create abilities which extend an application, to support easily adding new features, and to reduce the size of an application. When supported, plug-ins enable customizing the functionality of a software application. For example, plug-ins are commonly used in web browsers to play video, generate interactivity, scan for viruses, and display particular file types. Those of skill in the art will be familiar with several web browser plug-ins including, Adobe® Flash® Player, Microsoft® Silverlight®, and Apple® QuickTime®. In some embodiments, the toolbar comprises one or more web browser extensions, add-ins, or add-ons. In some embodiments, the toolbar comprises one or more explorer bars, tool bands, or desk bands.

In view of the disclosure provided herein, those of skill in the art will recognize that several plug-in frameworks are available that enable development of plug-ins in various programming languages, including, by way of non-limiting examples, C++, Delphi, Java™, PHP, Python™, and VB .NET, or combinations thereof.

Web browsers (also called Internet browsers) are software applications, designed for use with network-connected digital processing devices, for retrieving, presenting, and traversing information resources on the World Wide Web. Suitable web browsers include, by way of non-limiting examples, Microsoft® Internet Explorer®, Mozilla® Firefox®, Google® Chrome, Apple® Safari®, Opera Software® Opera®, and KDE Konqueror. In some embodiments, the web browser is a mobile web browser. Mobile web browsers (also called mircrobrowsers, mini-browsers, and wireless browsers) are designed for use on mobile digital processing devices including, by way of non-limiting examples, handheld computers, tablet computers, netbook computers, subnotebook computers, smartphones, music players, personal digital assistants (PDAs), and handheld video game systems. Suitable mobile web browsers include, by way of non-limiting examples, Google® Android® browser, RIM BlackBerry® Browser, Apple® Safari®, Palm® Blazer, Palm® WebOS® Browser, Mozilla® Firefox® for mobile, Microsoft® Internet Explorer® Mobile, Amazon® Kindle® Basic Web, Nokia® Browser, Opera Software Opera® Mobile, and Sony® PSP™ browser.

Software Modules

In some embodiments, the systems, media, and methods disclosed herein include software, server, and/or database modules, or use of the same. In view of the disclosure provided herein, software modules are created by techniques known to those of skill in the art using machines, software, and languages known to the art. The software modules disclosed herein are implemented in a multitude of ways. In various embodiments, a software module comprises a file, a section of code, a programming object, a programming structure, or combinations thereof. In further various embodiments, a software module comprises a plurality of files, a plurality of sections of code, a plurality of programming objects, a plurality of programming structures, or combinations thereof. In various embodiments, the one or more software modules comprise, by way of non-limiting examples, a web application, a mobile application, and a standalone application. In some embodiments, software modules are in one computer program or application. In other embodiments, software modules are in more than one computer program or application. In some embodiments, software modules are hosted on one machine. In other embodiments, software modules are hosted on more than one machine. In further embodiments, software modules are hosted on cloud computing platforms. In some embodiments, software modules are hosted on one or more machines in one location. In other embodiments, software modules are hosted on one or more machines in more than one location.

Databases

In some embodiments, the systems, media, and methods disclosed herein include one or more databases, or use of the same. In view of the disclosure provided herein, those of skill in the art will recognize that many databases are suitable for storage and retrieval of user, substrate, ruleset, module, module interface, and/or 3D printer instruction information. In various embodiments, suitable databases include, by way of non-limiting examples, relational databases, non-relational databases, object oriented databases, object databases, entity-relationship model databases, associative databases, and XML databases. Further non-limiting examples include SQL, PostgreSQL, MySQL, Oracle, DB2, and Sybase. In some embodiments, a database is internet-based. In further embodiments, a database is web-based. In still further embodiments, a database is cloud computing-based. In other embodiments, a database is based on one or more local computer storage devices.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention.

What is claimed is:

1. A computer-implemented system comprising a digital processing device comprising at least one processor, an operating system configured to perform executable instructions, a memory, and a computer program including instructions executable by the digital processing device to create a 3D modeling application for electronic products, the application comprising:
 a) a library of modules and module interfaces;
 b) a software module receiving at least one ruleset;
 c) a software module receiving preliminary substrate structure data describing an intermediate structure, the intermediate structure comprising an injection structure configured to inject a solution made of a conductive material into the intermediate structure;
 d) a software module presenting an interface allowing the user to place one or more modules on the intermediate structure;
 e) a software module presenting an interface allowing the user to place one or more module interfaces, the module interfaces coupling one or more modules together through the intermediate structure;
 f) a software module warning the user where placement of a module or module interface violates the at least one ruleset;
 g) a software module generating routing data of at least one location for at least one conductive trace between the placed module interfaces;
 h) a software module generating a finalized substrate structure model by combining the preliminary substrate structure data with module placement data and the routing data to define an electronic product, the electronic product to include the one or more modules, the one or more module interfaces, and the intermediate structure, the intermediate structure to include the at least one location for the at least one conductive trace and the injection structure configured to inject the solution made of the conductive material into the at least one location to form the at least one conductive trace, wherein the injection structure is configured to be removed from the intermediate structure subsequent to the conductive material being injected into the intermediate structure;
 i) a software module communicating an instruction file to a computer-controlled additive or subtractive manufacturing tool or system, the instruction file comprising one or more toolpaths to manufacture the electronic product according to the finalized substrate structure model.

2. The system of claim 1, wherein the library of predefined modules comprises one or more sensor modules, one or more processor modules, one or more storage modules, one or more communication modules, one or more display modules, and one or more power modules.

3. The system of claim 1, wherein the application further comprises a software module presenting an interface allowing the user to define custom modules and a custom module ruleset for each custom module.

4. The system of claim 1, wherein the interface to input preliminary substrate structure data comprises a 3D modeling tool.

5. The system of claim 4, wherein the 3D modeling tool is a voxel-based modeling tool.

6. The system of claim 1, wherein the software module receiving preliminary substrate structure data allows the user to import substrate structure data.

7. The system of claim 1, wherein the one or more module interfaces couple one or more modules together mechanically, electrically, or both mechanically and electrically.

8. The system of claim 1, wherein the application further comprises a software module presenting an interface allowing the user to define custom module interfaces.

9. The system of claim 1, wherein the warning prevents the user from taking an action.

10. The system of claim 1, wherein the at least one ruleset comprises: a fabrication ruleset, a material ruleset, and a module ruleset.

11. The system of claim 10, wherein the fabrication ruleset comprises rules directed to a material restriction, a tool restriction, or a technique restriction.

12. The system of claim 11, wherein the fabrication ruleset comprises rules directed to a minimum resolution, a maximum size, or a fabrication speed.

13. The system of claim 10, wherein the material ruleset comprises rules directed to a resolution, a size, an aspect ratio, or a fabrication speed.

14. The system of claim 10, wherein the module ruleset comprises rules directed to a connector placement, a mechanical binding, a semantic dependency, or a compatibility.

15. The system of claim 1, wherein the routing of the at least one location is generated by applying an A* path-finding algorithm.

16. The system of claim 1, wherein the routing of the at least one location adheres to the fabrication ruleset, the material ruleset, and the module ruleset.

17. The system of claim 1, wherein the instruction file is a STereoLithography (STL) file.

18. The system of claim 1, wherein the additive or subtractive manufacturing tool or system comprises: a 3D printer, an injection molding apparatus, CNC milling apparatus, waterjet cutting apparatus, lathe apparatus, or a combination thereof.

19. Non-transitory computer-readable storage media encoded with a computer program including instructions executable by a processor to create a 3D modeling application for electronic products comprising:
   a) a library of modules and module interfaces;
   b) a software module receiving at least one ruleset;
   c) a software module receiving preliminary substrate structure data describing an intermediate structure, the intermediate structure comprising an injection structure configured to inject a solution made of a conductive material into the intermediate structure;
   d) a software module presenting an interface allowing the user to place one or more modules on the intermediate structure;
   e) a software module presenting an interface allowing the user to place one or more module interfaces, the module interfaces coupling one or more modules together through the intermediate structure;
   f) a software module warning the user where placement of a module or module interface violates the at least one ruleset;
   g) a software module generating routing data of at least one location for at least one conductive trace between the placed module interfaces; and
   h) a software module generating a finalized substrate structure model by combining the preliminary substrate structure data with module placement data and the routing data to define an electronic product, the electronic product to include the one or more modules, the one or more module interfaces, and the intermediate structure, the intermediate structure to include the at least one location for the at least one conductive trace and the injection structure configured to inject the solution made of the conductive material into the at least one location to form the at least one conductive trace, wherein the injection structure is configured to be removed from the intermediate structure subsequent to the conductive material being injected into the intermediate structure; and
   i) a software module communicating an instruction file to a computer-controlled additive or subtractive manufacturing tool or system, the instruction file comprising one or more toolpaths to manufacture the electronic product according to the finalized substrate structure model.

20. A computer-implemented method for modeling 3D electronic products comprising:
   a) providing, in a computer memory, a library of modules and module interfaces;
   b) receiving, by a computer, at least one ruleset;
   c) receiving, by the computer, preliminary substrate structure data describing an intermediate structure, the intermediate structure comprising an injection structure configured to inject a solution made of a conductive material into the intermediate structure;
   d) presenting, by the computer, an interface allowing the user to place one or more modules on the intermediate structure;
   e) presenting, by the computer, an interface allowing the user to place one or more module interfaces, the module interfaces coupling one or more modules together through the intermediate structure;
   f) warning, by the computer, the user where placement of a module or module interface violates the at least one ruleset;
   g) generating, by the computer, routing data describing routing of at least one location for at least one conductive trace between the placed module interfaces; and
   h) generating, by the computer, a finalized substrate structure model by combining the preliminary substrate structure data with module placement data and routing data to define an electronic product, the electronic product to include the one or more modules, the one or more module interfaces, and the intermediate structure, the intermediate structure to include the at least one location for the at least one conductive trace and the injection structure configured to inject the solution made of the conductive material into the at least one location to form the at least one conductive trace, wherein the injection structure is configured to be removed from the intermediate structure subsequent to the conductive material being injected into the intermediate structure; and
   i) communicating, by the computer, an instruction file to a computer-controlled additive or subtractive manufacturing tool or system, the instruction file comprising one or more toolpaths to generate the electronic product according to the finalized substrate structure model.

* * * * *